(12) United States Patent
Lacey et al.

(10) Patent No.: US 11,368,166 B2
(45) Date of Patent: Jun. 21, 2022

(54) EFFICIENT ENCODING METHODS USING BIT INVERSION AND PADDING BITS

(71) Applicant: Imagination Technologies Limited, Kings Langley (GB)

(72) Inventors: Peter Malcolm Lacey, Hertfordshire (GB); Simon Fenney, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 17/218,063

(22) Filed: Mar. 30, 2021

(65) Prior Publication Data
US 2021/0351786 A1 Nov. 11, 2021

(30) Foreign Application Priority Data
Mar. 30, 2020 (GB) .................................... 2004590

(51) Int. Cl.
*H03M 7/00* (2006.01)
*H03M 7/30* (2006.01)

(52) U.S. Cl.
CPC ....... *H03M 7/3066* (2013.01); *H03M 7/6005* (2013.01); *H03M 7/6011* (2013.01)

(58) Field of Classification Search
CPC ............. H03M 7/3066; H03M 7/6005; H03M 7/6011; H03M 7/00
USPC .................................................... 341/50, 51
See application file for complete search history.

(56) References Cited

U.S. PATENT DOCUMENTS

| | | | |
|---|---|---|---|
| 4,115,768 A * | 9/1978 | Eggenberger | H03M 7/00 341/59 |
| 5,142,167 A | 8/1992 | Temple et al. | |
| 5,929,793 A * | 7/1999 | Choi | H03M 7/6029 341/67 |
| 7,149,955 B1 | 12/2006 | Sutardja et al. | |
| 7,501,963 B1 | 3/2009 | Hollis | |
| 8,952,834 B1 | 2/2015 | Cronie | |
| 2007/0280031 A1 | 12/2007 | Maejima et al. | |
| 2008/0030383 A1* | 2/2008 | Cameron | G06F 40/00 341/55 |
| 2009/0193319 A1 | 7/2009 | Shen et al. | |
| 2011/0025533 A1 | 2/2011 | Abbasfar | |
| 2018/0357188 A1 | 12/2018 | Brief | |

FOREIGN PATENT DOCUMENTS

| | | |
|---|---|---|
| DE | 3442477 A | 6/1986 |
| WO | 2009134568 A2 | 11/2009 |
| WO | 2011/090523 A | 7/2011 |
| WO | 2014205175 A2 | 12/2014 |

\* cited by examiner

*Primary Examiner* — Jean B Jeanglaude
(74) *Attorney, Agent, or Firm* — Potomac Law Group, PLLC; Vincent M DeLuca

(57) ABSTRACT

A method of encoding data values where the data values are arranged into words, each word having a plurality of input values and one or more padding bits. A word is encoded by determining whether more than half of the bits in a portion of the word are ones, where the portion may be some or all of the bits of the input values in the word, and in response to determining that more than half of the bits in the portion are ones, inverting all the bits in the portion and setting a corresponding padding bit to a value to indicate the inversion.

18 Claims, 18 Drawing Sheets

FIG. 1
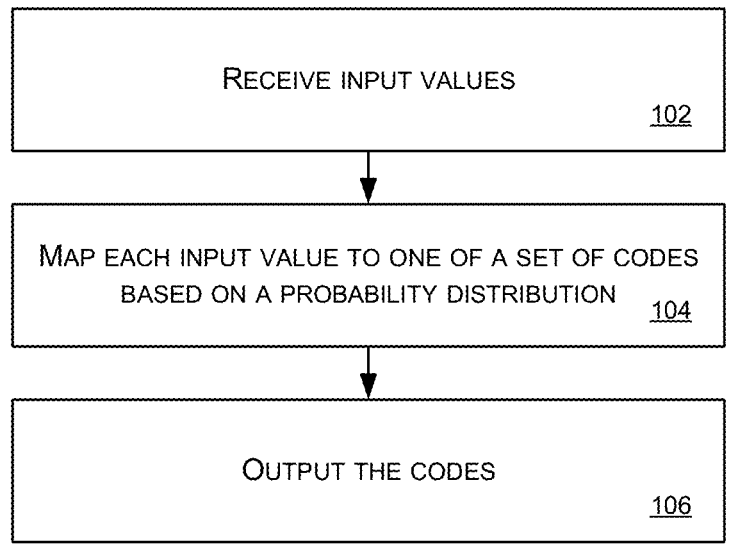
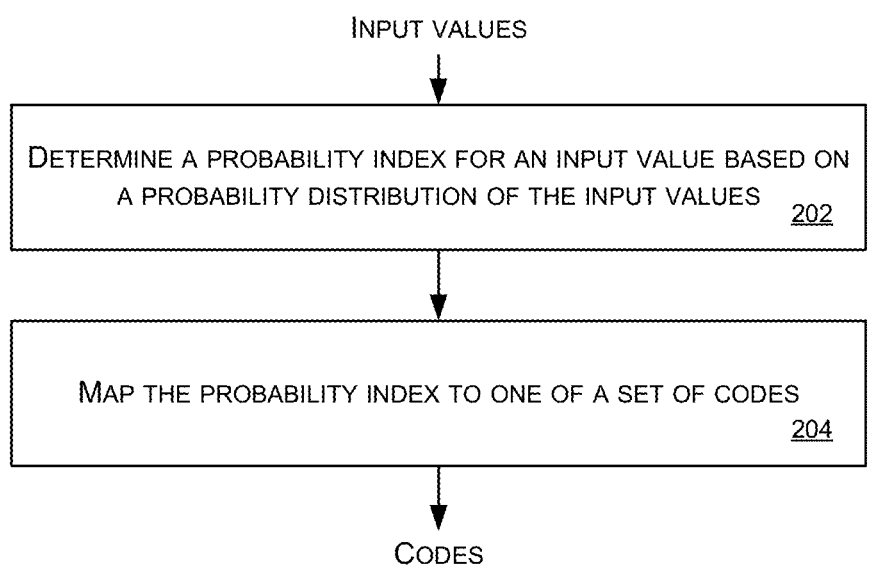
FIG. 2

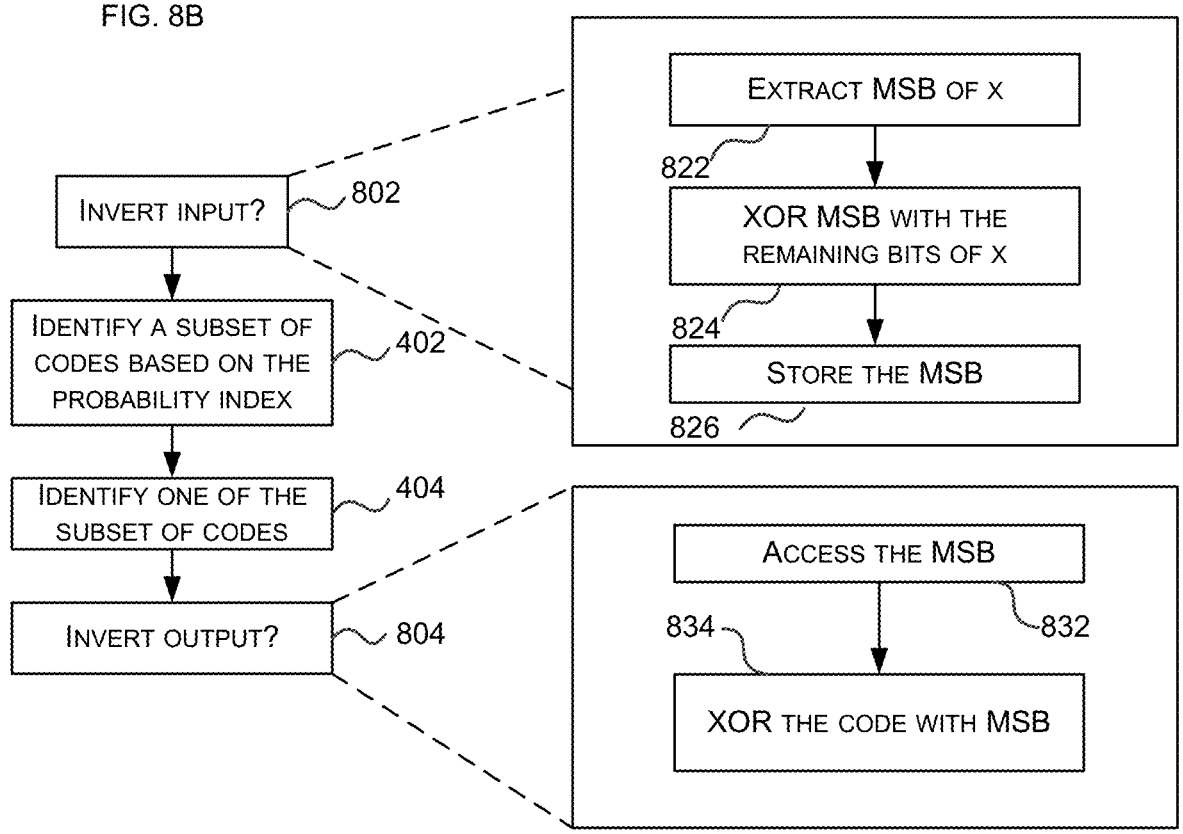
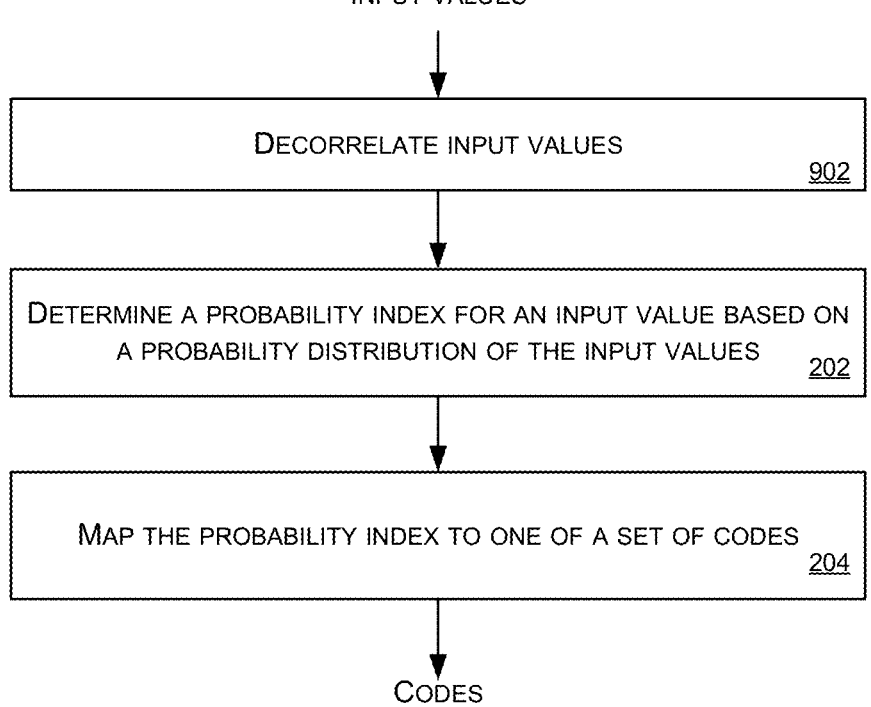

AVERAGE HW FOR L=10

NUMBER OF PADDING BITS

| PROBABILITY INDEX | | CODE | |
|---|---|---|---|
| DECIMAL | BINARY | | |
| 0 | 0 0 0 0 0 0 0 0 0 0 | 0 0 0 0 0 0 0 0 0 0 | ⎫ 1401 |
| 1 | 0 0 0 0 0 0 0 0 0 1 | 1 1 1 1 1 1 1 1 1 1 | ⎭ |
| 2 ⋮ 19 | 0 0 0 0 0 0 0 0 1 0 ⋮ 0 0 0 0 0 1 0 0 1 1 | 0 0 0 0 0 0 0 0 0 1 ⋮ 1 1 1 1 1 1 1 1 1 0 | ⎫ 1402 ⎭ |
| 20 ⋮ 91 | 0 0 0 0 0 1 0 1 0 0 ⋮ 0 0 0 1 0 1 1 0 1 1 | 0 0 0 0 0 0 0 0 1 0 ⋮ 1 1 1 1 1 1 1 1 0 1 | ⎫ 1403 ⎭ |
| 92 ⋮ 259 | 0 0 1 0 1 1 1 0 0 0 ⋮ 0 1 0 0 0 0 0 0 1 1 | 0 0 0 0 0 0 0 1 0 1 ⋮ 1 1 1 1 1 1 1 0 1 0 | ⎫ 1404 ⎭ |
| 260 ⋮ 511 | 0 1 0 0 0 0 0 1 0 0 ⋮ 0 1 1 1 1 1 1 1 1 1 | 0 0 0 0 0 0 1 0 1 0 ⋮ 1 1 1 1 1 1 0 1 0 1 | ⎫ 1405 ⎭ |
| 512 ⋮ 763 | 1 0 0 0 0 0 0 0 0 0 ⋮ 1 0 1 1 1 1 1 0 1 1 | 0 0 0 0 0 1 0 1 0 1 ⋮ 1 1 1 1 1 0 1 0 1 0 | ⎫ 1406 ⎭ |
| 764 ⋮ 931 | 1 0 1 1 1 1 1 1 0 0 ⋮ 1 1 1 0 1 0 0 0 1 1 | 0 0 0 0 1 0 1 0 1 0 ⋮ 1 1 1 1 0 1 0 1 0 1 | ⎫ 1407 ⎭ |
| 932 ⋮ 1003 | 1 1 1 0 1 0 0 1 0 0 ⋮ 1 1 1 1 1 0 1 0 1 1 | 0 0 0 1 0 1 0 1 0 1 ⋮ 1 1 1 0 1 0 1 0 1 0 | ⎫ 1408 ⎭ |
| 1004 ⋮ 1021 | 1 1 1 1 1 0 1 1 0 0 ⋮ 1 1 1 1 1 1 1 1 0 1 | 0 0 1 0 1 0 1 0 1 0 ⋮ 1 1 0 1 0 1 0 1 0 1 | ⎫ 1409 ⎭ |
| 1022 1023 | 1 1 1 1 1 1 1 1 1 0 1 1 1 1 1 1 1 1 1 1 | 0 1 0 1 0 1 0 1 0 1 1 0 1 0 1 0 1 0 1 0 | ⎫ 1410 ⎭ |

FIG. 14B

EFFICIENT ENCODING METHODS USING BIT INVERSION AND PADDING BITS

BACKGROUND

In a computing system, a processing unit (such as a CPU or GPU) often writes data to or reads data from external memory and this external memory access consumes a lot of power. For example, an external DRAM access may consume 50-100 times more power than comparable internal SRAM accesses. One solution to this is to use bus-invert coding. Bus-invert coding involves reducing the number of transitions in transmitted data by adding one or more extra bus lines and using these extra one or more bus lines to transmit a code that indicates whether the bus value corresponds to the data value or the inverted data value. To determine which to send over the bus (i.e. the data value or the inverted value), the number of bits that differ between the current data value and the next data value are determined and if this number is more than half of the total number of bits in the data value, the code transmitted on the extra bus line is set to one and the next bus value is set to the inverted next data value. If, however, the number of bits that differ is not more than half of the total number of bits in the data value, the code that is sent over the additional bus line is set to zero and the next bus value is set to the next data value.

The embodiments described below are provided by way of example only and are not limiting of implementations which solve any or all of the disadvantages of known methods of encoding (or re-encoding) data.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A method of encoding data values is described where the data values are arranged into words, each word comprising a plurality of input values and one or more padding bits. A word is encoded by determining whether more than half of bits in a portion of the word are ones, where the portion may comprise some or all of the bits of the input values in the word, and in response to determining that more than half of bits in the portion are ones, inverting all the bits in the portion and setting a corresponding padding bit to a value to indicate the inversion.

A first aspect provides a method of encoding data values, the method comprising: receiving a plurality of input words, each input word comprising one or more input values and one or more padding bits; determining whether more than half of the bits in a portion of an input word are have a predefined bit value; and in response to determining that more than half of the bits in a portion of an input word are ones, generating an output word by inverting all the bits in the portion and setting a padding bit to a value to indicate the inversion.

A second aspect provides a computing entity comprising an encoding hardware block, the encoding hardware block comprising: an input configured to receive a plurality of input values, each input word comprising one or more input values and one or more padding bits; hardware logic arranged to determine whether more than half of the bits in a portion of an input word have a predefined bit value and in response to determining that more than half of the bits in a portion of an input word have the predefined bit value, to generate an output word by inverting all the bits in the portion and setting a padding bit to a value to indicate the inversion; and an output for outputting the output words.

A third aspect provides a method of decoding data values, the method comprising: receiving a plurality of input words, each input word comprising one or more sections of bits and a padding bit corresponding to each section; and for each section of an input word: reading and analysing the value of the corresponding padding bit; in response to determining that the padding bit indicates that the section was flipped during the encoding process, flipping all the bits in the section and resetting the padding bit to its default value; in response to determining that the padding bit indicates that the section was not flipped during the encoding process, leaving the bits in the section unchanged and resetting the padding bit to its default value; and outputting the resultant bits as a decoded word.

A fourth aspect provides a computing entity comprising a decoding hardware block, the decoding hardware block comprising: an input configured to receive a plurality of input words, each input word comprising one or more sections of bits and a padding bit corresponding to each section; hardware logic arranged, for each section of an input word, to: read and analyse the value of the corresponding padding bit; in response to determining that the padding bit indicates that the section was flipped during the encoding process, flip all the bits in the section and reset the padding bit to its default value; and in response to determining that the padding bit indicates that the section was not flipped during the encoding process, leave the bits in the section unchanged and reset the padding bit to its default value; and an output for outputting the resultant bits as a decoded word.

The hardware logic arranged to perform a method as described herein may be embodied in hardware on an integrated circuit. There may be provided a method of manufacturing, at an integrated circuit manufacturing system, hardware logic (such as a processor or part thereof) arranged to perform a method as described herein. There may be provided an integrated circuit definition dataset that, when processed in an integrated circuit manufacturing system, configures the system to manufacture hardware logic (such as a processor or part thereof) arranged to perform a method as described herein. There may be provided a non-transitory computer readable storage medium having stored thereon a computer readable description of an integrated circuit that, when processed, causes a layout processing system to generate a circuit layout description used in an integrated circuit manufacturing system to manufacture hardware logic (such as a processor or part thereof) arranged to perform a method as described herein.

There may be provided an integrated circuit manufacturing system comprising: a non-transitory computer readable storage medium having stored thereon a computer readable integrated circuit description that describes the hardware logic (such as a processor or part thereof) arranged to perform a method as described herein; a layout processing system configured to process the integrated circuit description so as to generate a circuit layout description of an integrated circuit embodying the hardware logic (such as a processor or part thereof) arranged to perform a method as described herein; and an integrated circuit generation system configured to manufacture the hardware logic (such as a processor or part thereof) arranged to perform a method as described herein according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which:

FIG. 1 is a flow diagram of a first example method of power efficient encoding of data;

FIG. 2 is a flow diagram showing an example implementation of the mapping operation of the method of FIG. 1;

FIG. 7 shows an alternative representation of the method of FIG. 6;

FIGS. 8A and 8B are flow diagrams showing further example implementations of the mapping operation of the method of FIG. 2;

FIG. 9 is a flow diagram showing another example implementation of the mapping operation of the method of FIG. 1;

FIGS. 14A and 14B show two other example logic arrays that may be used to implement the mapping operation of FIG. 2;

Figure 3:
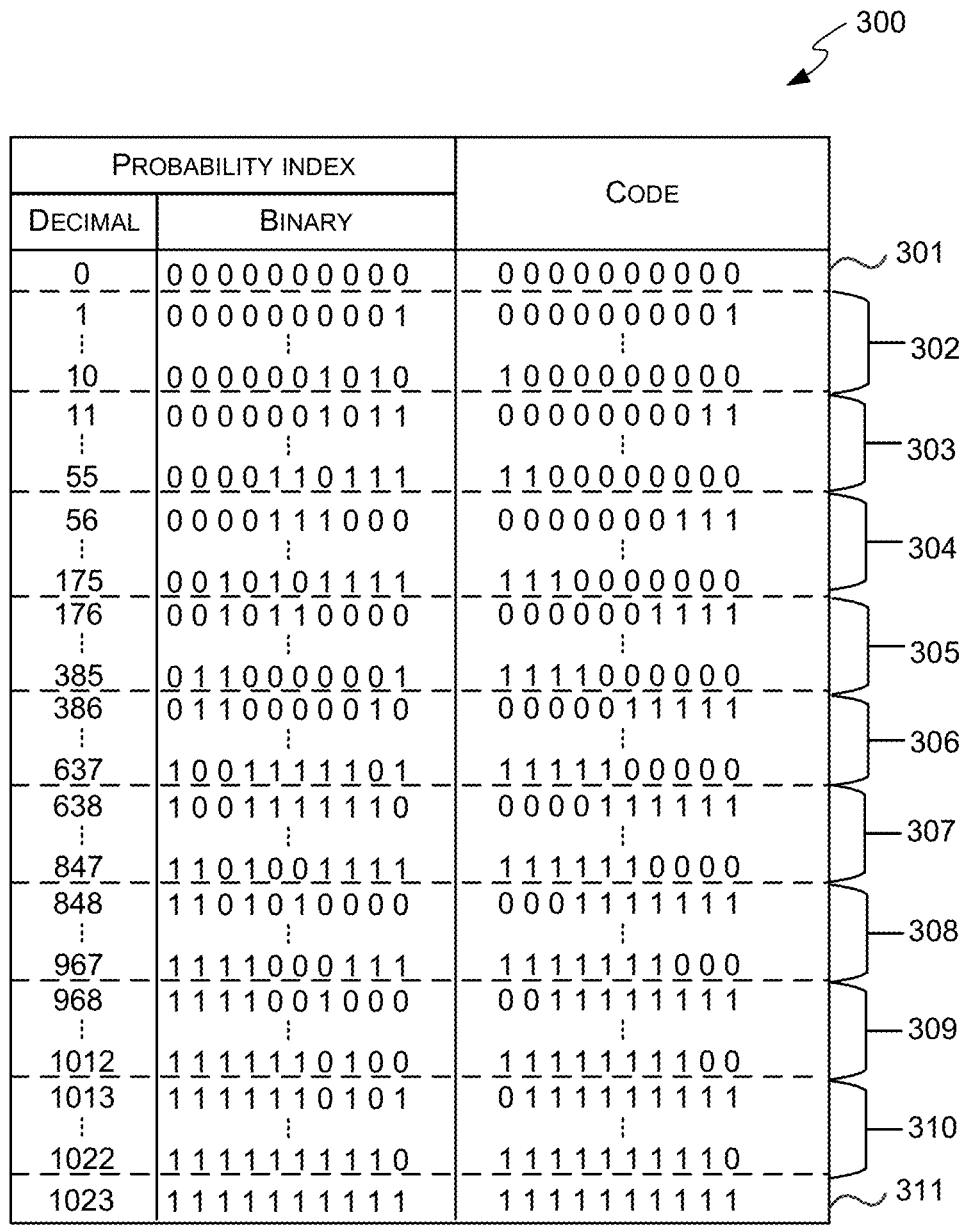
FIG. 3 shows an example LUT that may be used to implement the mapping operation of FIG. 2.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

As detailed above, external memory accesses consume a lot of power and hence can be a large proportion of the power budget of a computing system. This power consumption is, at least in part, a consequence of the capacitance of the bus over which the data travels and that means that it takes more power to change state than to maintain state. This is the rationale behind the known bus-invert coding method which seeks to reduce the number of transitions in the transmitted data (i.e. between one transmitted data value and the next transmitted data value). However, as described above, this method requires one or more additional bus lines and additionally requires extra hardware, such as specialised memories (e.g. with hardware that can reverse any bit inversion before the received data is stored) and additional encoders/decoders in the CPU/GPU. Furthermore, as the number of bits that are compared each time (in order to determine whether to send the bits or their inverted values) increases, the overall efficiency of bus-invert coding decreases significantly.

Described herein are various alternative methods of power efficient encoding of data values. In addition to reducing the power consumed when transmitting data over an external (i.e. off-chip) bus (e.g. to external memory or to another external module, such as a display controller), by using the methods described herein the power consumed when transmitting over an internal bus (whilst much lower than for an external bus) may also be reduced. The methods may additionally reduce the power consumed when storing the data (e.g. in an on-chip cache or an external memory), in particular in implementations where the storage device consumes less power when storing a zero compared to storing a one. These methods are therefore particularly suited to power constrained applications and environments, such as on mobile or other battery powered devices.

Unlike the known bus-invert coding method, the methods described herein do not require an additional bus line. Furthermore, many of the methods described herein may be used with non-specialised memories because the data may be stored in its efficiently encoded form even when the data is subsequently accessed randomly. In particular, where the resultant codes are fixed length (e.g. where the encoded length matches the original data value length), the memory does not need to be specialised. Use of fixed length codes makes random access straightforward as the data can be indexed into directly. Even where the resultant codes are not fixed length, where they are a multiple of a particular unit (e.g. a nibble) in size, a specialised memory is not required but only a memory that can read/write at the given granularity (e.g. nibble stride).

FIG. 1 is a flow diagram of a first example method of power efficient encoding of data. The method comprises receiving input values (block 102), mapping each input value to one of a set of codes based on a probability distribution of the input values (block 104) and outputting the codes corresponding to the received input values (block 106).

The input data (i.e. the input values received in block 102) may be any type of data and input values may have any bit-widths (e.g. 4, 8, 10, 16 bits or other bit-widths comprising an even number of bits and/or bit-widths comprising an odd number of bits). In various examples, the data may be data that has an associated non-uniform probability distribution (and hence can be sorted by its probabilities in a meaningful way). The associated non-uniform probability distribution need not be perfectly accurate to its actual probability distribution. In other examples, the data may be data with an associated probability distribution that is uniformly random or data that has no probability distribution and, as these are equivalent in practice, they are treated identically. Consequently, in the following description the phrases 'data without a probability distribution' and 'data with a uniformly random probability distribution' are used interchangeably.

In various examples the input data may be graphics data (e.g. pixel data), audio data, industrial sensor data or error correcting codes (ECC). In various examples, where the input data is graphics data, the input values may be scanline data of colour channels, e.g. RGB, RGBX, RGBA, YUV, planar Y, planar U, planar V or UVUV or other pixel data such as the content of frame buffers or height/depth/normal maps.

In many of the examples described herein, the input values are unsigned values or unsigned codes representing characters; however, the input values may alternatively be of other data types (e.g. signed or floating point values). Where the input values are not unsigned values, a different probability distribution may need to be considered and various aspects of the method (e.g. the decorrelation and probability sorting) may need to be modified accordingly. For example, signed values are distributed around zero like decorrelated unsigned values so can simply be sign remapped and floating point values will often be distributed similarly to unsigned or signed fixed point values depending upon what they represent (e.g. evenly around a middle value) but are encoded differently, so (after appropriate decorrelation/shifting) require a different sign remapping (e.g. moving the sign bit from the MSB to the LSB). This is described in more detail below.

In various examples, the codes in the pre-defined set of codes may each comprise the same number of bits as the input values and for the purposes of the following description, N is the bit-length of an output code and L is the bit-length of an input value. In other examples, however, some or all of the codes may comprise more bits than the input values (i.e. N>L). In various examples, the set of codes may comprise a plurality of subsets, with each subset of codes comprising codes of different bit lengths. For example, the set of codes may comprise a first subset comprising 10-bit codes and a second subset comprising 12-bit codes. The subsets of codes with the same bit length may each be further divided into smaller subsets based on a characteristic of the codes, e.g. based on the number of ones in a code (i.e. the Hamming Weight, HW, of a code) or the number of bit flips within a code (i.e. the number of 1-0 or 0-1 transitions within the sequence of bits representing a code), as described below.

In various examples one or more input values may be grouped into data words of any size (e.g. 8, 16, 32 bits) including none, one or more padding bits. For example, where the input data is pixel data, the input data may comprise data words each comprising 3 or 4 input values of either 10 bits in length or 8 bits in length respectively (e.g. for YUV/RGB or RGBX/RGBA data). In such examples the input values in a data word may each be separately mapped to one of the set of codes and then the resultant codes may be combined to form an output data word (e.g. comprising three or four concatenated codes). In various examples the data words may include one or more padding bits, in addition to the plurality of input values, e.g. 10-bit and 8-bit data values may be packed into 32-bit data words comprising three input values along with 2 or 8 padding bits respectively. As described in more detail below, the padding bits may be left unchanged when performing the encoding methods described herein (e.g. they may be removed from the input data word prior to the mapping of the input values and then included in the output data word when the resultant codes are combined) or one or more of the padding bits (and in some examples, all of the padding bits) may be utilised to allow longer (and more efficient) codes (where N>L) for one or more of the input values in a data word.

The mapping (in block 104) may be performed in many different ways. In various examples, the mapping may use a pre-computed LUT that maps possible input values to codes from the pre-defined set of codes. The LUT may be pre-computed based on the probability distribution of the input values where this is known in advance (e.g. for alphabetic characters). LUTs are more suitable for shorter input values, e.g. input values comprising up to a maximum of around 10 bits, than for longer input values (e.g. input values comprising 32 bits), because otherwise a lot of gates are required to implement the LUT and it may be more efficient (e.g. in terms of silicon area or power) to perform the mapping in another way and other methods are described below.

The term 'logic array' is used herein to refer to a layout of gates configured to map a set of input binary codes (e.g. input values) to a set of output binary codes (e.g. codes from the set of pre-defined codes). The term 'data array' is used herein to refer to an array of binary results indexed by input values. Logic arrays and data arrays are both implementations of binary mappings and their use may be interchangeable (e.g. where use of a data array is described herein, a logic array may alternative be used, and vice versa). In general logic arrays are a more hardware-centric solution whilst data arrays are suitable for either hardware- or software-centric solutions. The term 'look-up table' (LUT) is used herein to refer to either a logic array or a data array.

FIG. 2 is a flow diagram showing another example implementation of the mapping operation (block 104) of the method of FIG. 1. In this example, the mapping operation (of block 104) comprises two stages. First, a probability index is determined for an input value based on the probability distribution of the input values (block 202), i.e. based on the frequency with which particular input values occur or are expected to occur. This operation may be referred to as 'probability sorting'. As described below, dependent upon the type of data, the probability index may not exactly sort the input values into an order of decreasing probability; however, it does result in the ordering of input values so that they are approximately ordered from most likely values (with indices closer to zero) to least likely values (with larger indices). Any errors in the ordering reduce the efficiency gains that are achieved through the use of the method but do not prevent the method from operating and providing benefit. For input values with a uniformly random probability distribution (i.e. where each of the $2^L$ input values have the probability $2^{-L}$) and where N=L, the method may still be used; however, the average Hamming Weight will not be reduced.

Having determined a probability index for an input value (in block 202), the probability index (and hence the input value) is mapped to one of a pre-defined set of codes based on either a number of ones or a number of bit flips that are present in the pre-defined codes (block 204) and the resultant code (i.e. the code identified by the mapping operation) is then output. According to this mapping operation, those input values with a lower probability index (and hence higher probability of occurring) may be mapped to those codes, from the pre-defined set of codes, with fewer ones. Alternatively, instead of assigning codes based on the number of ones in the codes (i.e. based on the HW of the code), the input values with a lower probability index (and hence higher probability of occurring) may be mapped to those codes, from the pre-defined set of codes, with fewer bit flips. In the methods described herein the number of bit flips that is used in the mapping (in block 204) refers to bit flips within the particular code when considered as a sequence of bits (and not the Hamming Distance between the particular code and another code).

Whilst not shown in FIG. 2, the mapping (in block 104) may further comprise a pre-processing operation prior to the probability sorting (in block 202) and/or a post-processing operation after the mapping (in block 204). These additional, optional, operations are described below.

The probability index, x, may be determined (in block 202) in many different ways and as described above, the aim for the probability index is that if $p_x$ is the probability of an input value being mapped to x, then $p_0 \geq p_1 \geq p_2 \geq p_3 \ldots$, although as described above, in various examples, the determination of the probability index may only be an approximation to the ordering given by the actual probability distribution of the data. For example, the most common k input values may be mapped to indices 0, ..., k−1 and all other input values may be mapped to any of the other indices injectively (to guarantee invertibility).

In various examples, the probability index may be determined using a LUT (e.g. a pre-computed logic array) between input values and probability indices. The LUT may be pre-computed based on the probability distribution of the input values where this is known in advance (e.g. for alphabetic characters). LUTs are more suitable for shorter input values, e.g. input values comprising up to a maximum of around 10 bits, than for longer input values (e.g. input values comprising 32 bits), because otherwise a lot of gates are required to implement the logic array and it may be more efficient (e.g. in terms of silicon area or power) to generate the probability index in another way (e.g. using an iterative algorithm).

Whilst the use of a LUT to determine the probability index is agnostic to the type or format of the input values, in other examples (e.g. where the probability index for an input value is determined by transforming the input value itself), the method of determining the probability index (in block 202) may be dependent, at least in part, on the type or format of the input values (e.g. whether signed or unsigned, floating or fixed point, etc.) and/or on the probability distribution of the input values and/or on the way that the input values were generated. For example, where the input values are distributed approximately symmetrically about zero with the peak of the probability distribution being at zero or close to zero, then the probability indices may be determined by applying sign remapping to the input values. In examples where the input values are distributed approximately symmetrically about another value (such that the peak of the probability distribution is at that other value), then the input values may first be shifted (such that they are distributed approximately symmetrically about zero) before applying sign remapping to the shifted input values. Sign remapping for fixed point values comprises shifting the input value to the left by one bit position (which involves adding a zero as the new least significant bit, LSB), removing the most significant bit (MSB) and then XORing all the remaining bits with the just removed MSB. In the case of (signed) floating point values sign remapping comprises moving the sign bit from the MSB to the LSB: For a (signed) floating-point format, first the positive values are ordered increasingly followed by the negative values ordered decreasingly, therefore moving the sign-bit to the LSB interleaves these values and orders the values by their distance from 0. If the decorrelation operation described below (with reference to FIG. 9) is used on the floating-point input values, then as well as shifting the sign-bit from the MSB to the LSB, the remaining bits must also be XORed by the sign-bit—to undo the original XORing. In this way, the input value and the resulting probability index comprise the same number of bits. In other examples, the probability index may be generated in a manner that results in an index with a different number of bits from the input value, e.g. with some number of 0s padding the MSB end of the probability index.

In another example, where the input values are generated using a lossless encoding method (e.g. Huffman encoding) and where the input values are of variable length, the probability index may be determined (in block 202) based on the length of the input value (e.g. with the shortest input values being most probable and hence being allocated a lower probability index and the longest input values being least probable and hence allocated a higher probability index). In a further example where the input values are generated using a lossless encoding method but where the encoded values are padded up to a fixed bit length to generate the input values by adding a tail portion (e.g. a one followed by none, one or more zeros), the probability index may be determined (in block 202) based on the length of the tail portion of the input value (e.g. with the input values with the longest tail portions being most probable and hence being allocated a lower probability index and the input values with the shortest tail portions being least probable and hence allocated a higher probability index). A detailed example that involves Huffman encoding is described below.

In a further example, the probability index may be determined (in block 202) using a probability distribution builder that accumulates frequencies for each possible value and orders the values by them. This method may be used where the probability distribution is not known in advance. The distribution would be generated in an identical manner for both encode and decode operations to ensure correct decoding. In a first example implementation, the distribution is generated (by the probability distribution builder) using the first X input values (where X is an integer) and then used (whilst remaining fixed) for all remaining data.

The value of X may be dependent upon the number of input bits, L, and may be more suited to smaller inputs, where explicitly storing the distribution would not require excessive storage. For example, for L=4 there are 16 possible values and hence the distribution that is stored is for these 16 possible inputs. Consequently, the value of X may be selected such that X>>16, e.g. X=256, to ensure that the distribution that is generated provides a good approximation to the actual distribution, and in this case the probability distribution that is generated may comprise a 4-bit frequency for each input, totalling 64 bits. More generally, for L-bit inputs and F-bit frequencies for each input, a total of $2L*F$ bits are needed to store the distribution, which grows exponentially with L. In this case X may be selected to be of the order of $2^L*2^F=2^{(L+F)}$, but a smaller value of X may be appropriate if the distribution is particularly skewed (and this skew is known in advance).

In a second example implementation, the distribution is completely dynamic and continuously updated by the probability distribution builder, e.g. the distribution may be updated for each input value, word or block of words, where at the point of overflow (e.g. at the point any frequency count reaches the maximal value that can be stored in the F-bit frequency) all frequencies are scaled down (e.g. by dividing by two) before continuing. In other examples, the overflow situation may be handled differently (e.g. by clamping the frequency count at the maximal value; however this would result in a less accurate probability distribution than scaling down the frequencies).

The probability index may be inferred from the distribution each time an input needs to be encoded (e.g. for a dynamic distribution), or instead the distribution may be referenced once in advance to generate and store the probability index for each input in a pre-computed LUT (e.g. for a static distribution). This may be combined with the LUT described below with reference to FIG. 3. In various examples, the probability distribution builder may be seeded with a 'best guess' distribution so that it converges more quickly. This may provide a more efficient hardware implementation, e.g. for a dynamic distribution where the data changes significantly over time.

In yet another example implementation, which may be particularly suited to large values of L (where the previously described implementations may be less optimal), a simplified probability sorting may be implemented such that all inputs with frequencies over a pre-defined threshold are identified and these inputs are assigned to the lowest probability indices and all other inputs are assigned injectively to the remaining probability indices.

In examples where the probability distribution is generated dynamically, data that indicates how input values are related to the probability indices may be stored and reused to enable the data to be subsequently decoded. Alternatively, the probability distribution may be generated at both encode and decode in an identical manner. For static (i.e. known) distributions (e.g. which are known from previous observations), the distribution is implicitly encoded in the functionality of the decorrelation and probability sorting operations (e.g. shifting and sign remapping) and the encoder and decoder may use corresponding inverse mappings.

The mapping (in block 204) may be performed in many different ways. In various examples, the mapping may use a LUT (e.g. a pre-computed logic array) that maps between probability indices and the pre-defined set of codes and an example is described below with reference to FIG. 3. This LUT comprises only 10-bit codes and this may be because the pre-defined set of codes only comprises 10-bit codes or because separate LUTs are provided for each subset of codes, with each subset corresponding to a bit length and comprising codes of the particular bit length. It will be appreciated, however, that in further examples, a single LUT may comprise all the codes in the pre-defined set of codes (e.g. grouped by bit length).

The example LUT 300 shown in FIG. 3 comprises 10-bit probability indices and 10-bit codes and may be used for input values that are no more than 10 bits in length (so that the mapping may remain invertible). This example, and subsequent methods are described for mapping operations (in block 204) in which the probability index (and hence the input value) is mapped to one of a pre-defined set of codes based on a number of ones that are present in the pre-defined codes. The modifications to the methods where the mapping is instead performed based on the number of bit flips that are present in the pre-defined codes are described subsequently.

As shown in FIG. 3, the group of 10-bit codes (which may be the entire set of pre-defined codes or a subset thereof) is sub-divided into a plurality of subsets 301-311, each comprising one or more codes that contain the same number of ones (i.e. that has the same Hamming Weight). Within each subset, the codes with the same HW may be ordered in any way and in the example shown they are ordered lexicographically. As shown in FIG. 3, whilst in a few cases the 10-bit binary version of the probability index matches the 10-bit code, in the majority of cases the two are different.

Figure 4:
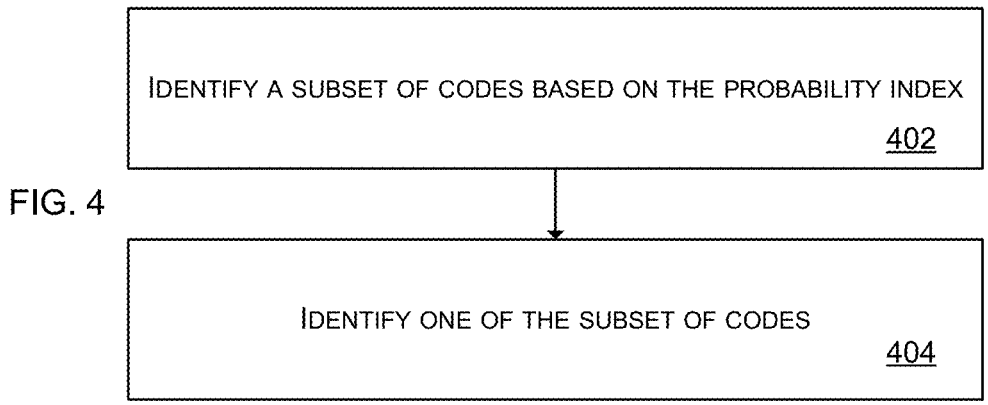
FIG. 4 is a flow diagram showing another example implementation of the mapping operation of the method of FIG. 2.

In other examples, as shown in FIG. 4, the mapping may be performed by first identifying a subset of codes based on the probability index (block 402), where these subsets are those shown in FIG. 3 and described above (i.e. each subset corresponds to a different HW and comprises only those codes from the set of codes with the particular HW), and then selecting one of the codes in the identified subset of codes (block 404). Given that there is a one-to-one relationship between subsets and Hamming Weights, the method of FIG. 4 may alternatively be described as computing the HW of the code (in block 402) and then identifying a code with the computed HW (in block 404).

Figure 5A:
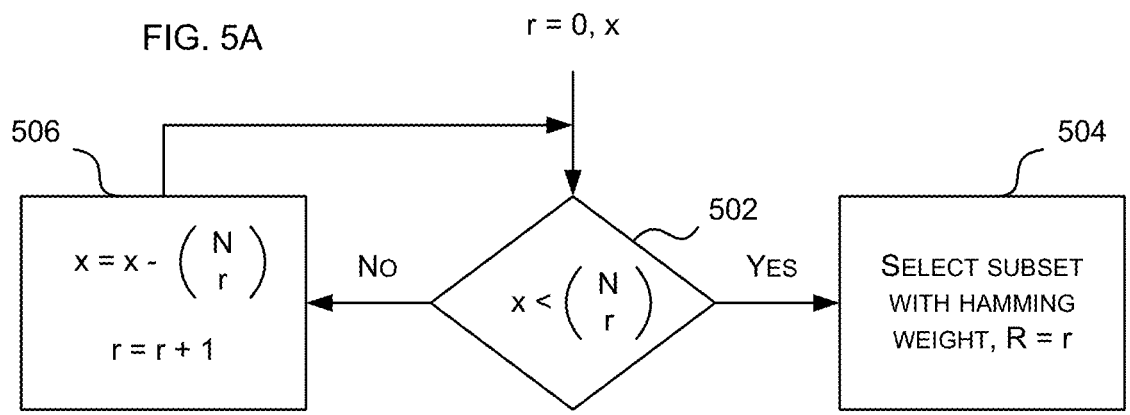
FIGS. 5A and 5B are flow diagrams showing example methods of identifying a subset of the pre-defined set of codes.

The subset of codes may, for example, be identified (in block 402) by iteratively subtracting the binomial coefficient $$\binom{N}{r}$$

from the probability index, x, where N is the number of bits in the code and initially r=0. As shown in FIG. 5A, the probability index, x, is initially compared to the binomial coefficient with r=0 (block 502), which is equal to one (irrespective of the value of N). If the probability index is strictly less than one ('Yes' in block 502), i.e. it is zero, then the first subset 301, with a Hamming Weight, R, of 0, is selected (block 504). Otherwise, the value of the binomial coefficient (i.e. one, in this first iteration) is subtracted from the probability index and the value of r is incremented by one (block 506). In subsequent iterations, the updated probability index, i.e. the updated value of x, from the previous iteration is compared to the binomial coefficient with the current value of r (in block 502) and if the updated probability index, x is strictly less than the binomial coefficient ('Yes' in block 502), then the subset with a HW equal to the current value of r is selected, i.e. where R=r (block 504). If, however, the updated probability index, x is not strictly less than the binomial coefficient ('No' in block 502), then the value of the binomial coefficient (with the current value of r) is subtracted from the updated probability index and the value of r is incremented by one (block 506). The values of the binomial coefficients that are used in selecting the subset (in blocks 502 and 506) may be calculated or may be obtained from a LUT that contains a list of pre-generated values.

An example LUT for binomial coefficients is shown below with the columns corresponding to different values of N (or n, for subsequent methods which calculate $$\binom{n}{r}$$

from 0 to 12 and the rows corresponding to different values of r from 0 to 5. This LUT is designed to be used where L=10 and N=12; however they may also be used for any smaller values of L and/or N). In practice, the LUT that is used may omit one or more of the columns or rows below where these are not used (e.g. where N<12) and the LUT may be stored in any format that can be accessed using appropriate indexing (e.g. based on values of n and r) e.g. row-wise or column-wise.

|   | N | | | | | | | | | | | | |
|---|---|---|---|---|---|---|---|---|---|---|---|---|---|
| r | 0 | 1 | 2 | 3 | 4 | 5 | 6 | 7 | 8 | 9 | 10 | 11 | 12 |
| 0 | 1 | 1 | 1 | 1 | 1 | 1 | 1 | 1 | 1 | 1 | 1 | 1 | 1 |
| 1 | 0 | 1 | 2 | 3 | 4 | 5 | 6 | 7 | 8 | 9 | 10 | 11 | 12 |
| 2 | 0 | 0 | 1 | 3 | 6 | 10 | 15 | 21 | 28 | 36 | 45 | 55 | 66 |
| 3 | 0 | 0 | 0 | 1 | 4 | 10 | 20 | 35 | 56 | 84 | 120 | 165 | 220 |
| 4 | 0 | 0 | 0 | 0 | 1 | 5 | 15 | 35 | 70 | 126 | 210 | 330 | 495 |
| 5 | 0 | 0 | 0 | 0 | 0 | 1 | 6 | 21 | 56 | 126 | 252 | 462 | 792 |

Furthermore, by noting that $$\binom{N}{0} = 1$$

for all N, the first row may be omitted (e.g. since for wide LUTs, saving the space used to store a row in the LUT is more significant than the additional logic needed to perform a comparison on the index r) and by noting that $$\binom{N}{1} = N$$

for all N, the second row may be omitted. In addition (or instead) as $$\binom{0}{r} = \binom{1}{r} = 0 \text{ for } r > 1,$$

the first two columns may be omitted. The omission of the first two rows and columns results in a smaller LUT:

|   | N | | | | | | | | | | | |
|---|---|---|---|---|---|---|---|---|---|---|---|---|
| r | 2 | 3 | 4 | 5 | 6 | 7 | 8 | 9 | 10 | 11 | 12 |
| 2 | 1 | 3 | 6 | 10 | 15 | 21 | 28 | 36 | 45 | 55 | 66 |
| 3 | 0 | 1 | 4 | 10 | 20 | 35 | 56 | 84 | 120 | 165 | 220 |
| 4 | 0 | 0 | 1 | 5 | 15 | 35 | 70 | 126 | 210 | 330 | 495 |
| 5 | 0 | 0 | 0 | 1 | 6 | 21 | 56 | 126 | 252 | 462 | 792 |

Figure 5B:
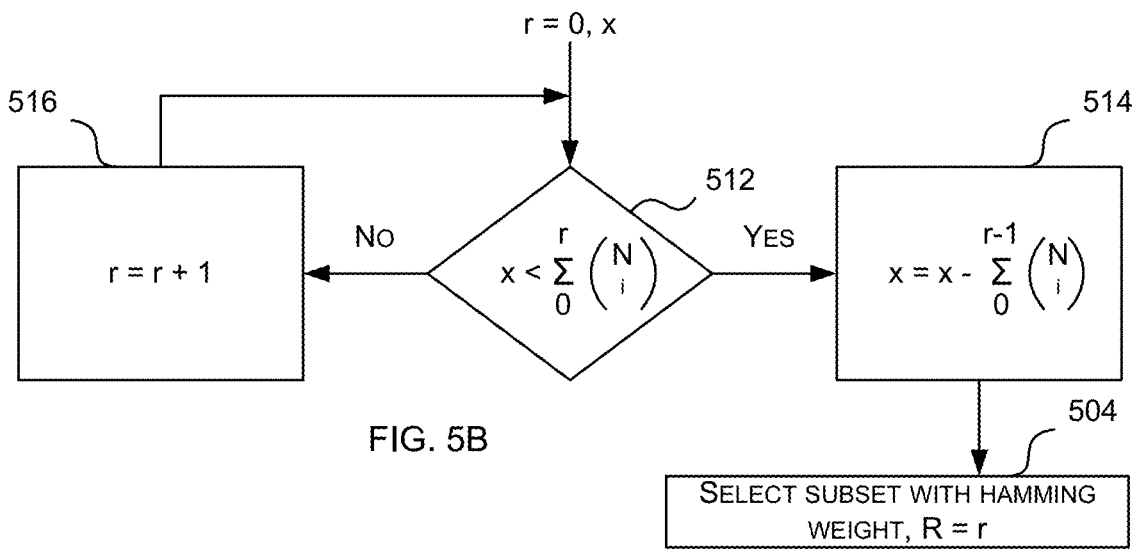

In various examples, the hardware logic that is used to implement the methods described herein may be simplified, as shown in FIG. 5B, if the final column of the LUT stores the cumulative value $$\sum_{r=0}^{R} \binom{12}{r}$$

instead of $$\binom{12}{r},$$

resulting in a LUT as below:

|   | N | | | | | | | | | | | | |
|---|---|---|---|---|---|---|---|---|---|---|---|---|---|
| r | 0 | 1 | 2 | 3 | 4 | 5 | 6 | 7 | 8 | 9 | 10 | 11 | 12 |
| 0 | 1 | 1 | 1 | 1 | 1 | 1 | 1 | 1 | 1 | 1 | 1 | 1 | 1 |
| 1 | 0 | 1 | 2 | 3 | 4 | 5 | 6 | 7 | 8 | 9 | 10 | 11 | 13 |
| 2 | 0 | 0 | 1 | 3 | 6 | 10 | 15 | 21 | 28 | 36 | 45 | 55 | 79 |
| 3 | 0 | 0 | 0 | 1 | 4 | 10 | 20 | 35 | 56 | 84 | 120 | 165 | 299 |

|   | N |   |   |   |   |   |   |   |   |   |   |   |
|---|---|---|---|---|---|---|---|---|---|---|---|---|
| r | 0 | 1 | 2 | 3 | 4 | 5 | 6 | 7 | 8 | 9 | 10 | 11 | 12 |
| 4 | 0 | 0 | 0 | 0 | 1 | 5 | 15 | 35 | 70 | 126 | 210 | 330 | 794 |
| 5 | 0 | 0 | 0 | 0 | 0 | 1 | 6 | 21 | 56 | 126 | 252 | 462 | 1586 |

Or, where the first two rows and columns are removed:

|   | N |   |   |   |   |   |   |   |   |   |   |
|---|---|---|---|---|---|---|---|---|---|---|---|
| r | 2 | 3 | 4 | 5 | 6 | 7 | 8 | 9 | 10 | 11 | 12 |
| 2 | 1 | 3 | 6 | 10 | 15 | 21 | 28 | 36 | 45 | 55 | 79 |
| 3 | 0 | 1 | 4 | 10 | 20 | 35 | 56 | 84 | 120 | 165 | 299 |
| 4 | 0 | 0 | 1 | 5 | 15 | 35 | 70 | 126 | 210 | 330 | 794 |
| 5 | 0 | 0 | 0 | 1 | 6 | 21 | 56 | 126 | 252 | 462 | 1586 |

The two latter example LUTs above (i.e. with cumulative coefficients in the final column) may be particularly suited to implementations which use a single value of N (e.g. N=12 in the example shown) as they can then be used with the logic that implements the method of FIG. 5B. Although this only uses the last column of the LUT (i.e. the cumulative values), the other columns may still be included in the LUT because they may be used in the subsequent stage, i.e. the identification of a specific code from the subset (in block 404—this uses the normal binomial coefficients for all n<N). Alternatively, the last column may be stored as a separate LUT.

In implementations that use multiple values for N (e.g. N=10 and N=12), then it may be more efficient to use the two former example LUTs above (i.e. store the normal binomial coefficients in all columns, rather than the cumulative binomial coefficients in any columns of the LUT) and use the logic for FIG. 5A in both cases, because the identification of codes (in block 404) uses the normal binomial coefficients for all n<N. Otherwise it is necessary to implement the logic for FIG. 5B, which is used for N=12, and the logic for FIG. 5A, which is used for N=10.

As shown in FIG. 5B, through the use of the cumulative value (in the comparison of block 512), the update step (block 516) in the loop only comprises an increment to the value of r (instead of also updating the value of the probability index, as in block 506 of FIG. 5A) and there is a single subtraction operation that calculates the final, updated value of the probability index x (block 514). This subtraction operation (in block 514) subtracts the cumulative value $$\sum_{i=0}^{i=r-1} \binom{N}{i},$$

which may be read from the LUT, from the original probability index to generate the final, updated version of the probability index in a single step. Although FIG. 5B comprises one additional block to the flow diagram in FIG. 5A, the amount of processing (and hence latency) is reduced because of the simplification of the loop to a single increment (in block 516), which is also less costly to unroll in terms of silicon area.

Accessing values from the LUT above (which may also be referred to as a 'table of binary coefficients') may be implemented as shown in the following pseudo-code:

```
unsigned nCr( unsigned n, unsigned r )
{
    if ( r = 0 ) return 1;
    if ( r = 1 ) return n;
    if ( n < 2 ) return 0;
    //Table of binary coefficients
    unsigned bin_coeffs[4][11] =
    {
        1, 3, 6, 10, 15, 21, 28, 36, 45, 55, 79,
        0, 1, 4, 10, 20, 35, 56, 84, 120, 165, 299,
        0, 0, 1, 5, 15, 35, 70, 126, 210, 330, 794,
        0, 0, 0, 1, 6, 21, 56, 126, 252, 462, 1586
    };
    return bin_coeffs[r - 2][n - 2];
}
```

In other examples, the subset of codes may be identified (in block 402) using a LUT that maps probability indices to subsets, or to HWs that themselves identify a subset for a particular code length and an example for N=10 is shown below.

| Minimum index | Maximum index | Hamming Weight, R |
|---|---|---|
| 0 | 0 | 0 |
| 1 | 10 | 1 |
| 11 | 55 | 2 |
| 56 | 175 | 3 |
| 176 | 385 | 4 |
| 386 | 637 | 5 |
| 638 | 847 | 6 |
| 848 | 967 | 7 |
| 968 | 1012 | 8 |
| 1013 | 1022 | 9 |
| 1023 | 1023 | 10 |

For example, where N=10 and x=10, a subset with R=1 is selected and where N=10 and x=37, a subset with a R=2 is selected.

Instead of using the LUT above, the right-hand column of the earlier LUT that includes the cumulative binomial coefficients may be used instead. The 'maximum index' above is one less than its corresponding cumulative binomial coefficient from the earlier LUT. In this case, instead of determining whether the index is less than or equal to the maximum index, the comparison is changed to determining whether the index is strictly less than the cumulative binomial coefficient.

Having identified the subset (in block 402), for example using one of the methods described above, information determined as part of the identification of the subset may be used to select a code from the identified subset (in block 404). For example, where the method of FIG. 5A or 5B is used, the final updated value of the probability index, x, may be used to select one of the codes in the identified subset as it provides the relative position of the code to be selected within the subset (e.g. by selecting the $(x+1)^{th}$ code in the subset). Where the LUT above is used, the final updated value of the probability index has not been calculated (in block 402); however, this may be obtained by subtracting the minimum index for the identified subset from the probability index (in an operation which is identical to the single subtraction in block 514 of FIG. 5B) and then used as an indicator of the relative position of the code to be selected within the identified subset (in block 404). Referring back to the earlier examples, where N=10 and the initial value of the probability index is 10 (i.e. initially x=10), the final updated value of the probability index x=10−1=9 and hence the input value is mapped to the code in position 9 in the subset with R=1 (assuming that the first code in the subset is in position 0). Similarly, where N=10 and the initial value of the probability index is 37 (i.e. initially x=37), the final updated value of the probability index x=37−11=26 and hence the input value is mapped to the code in position 26 in the subset with R=2.

Figure 6A:
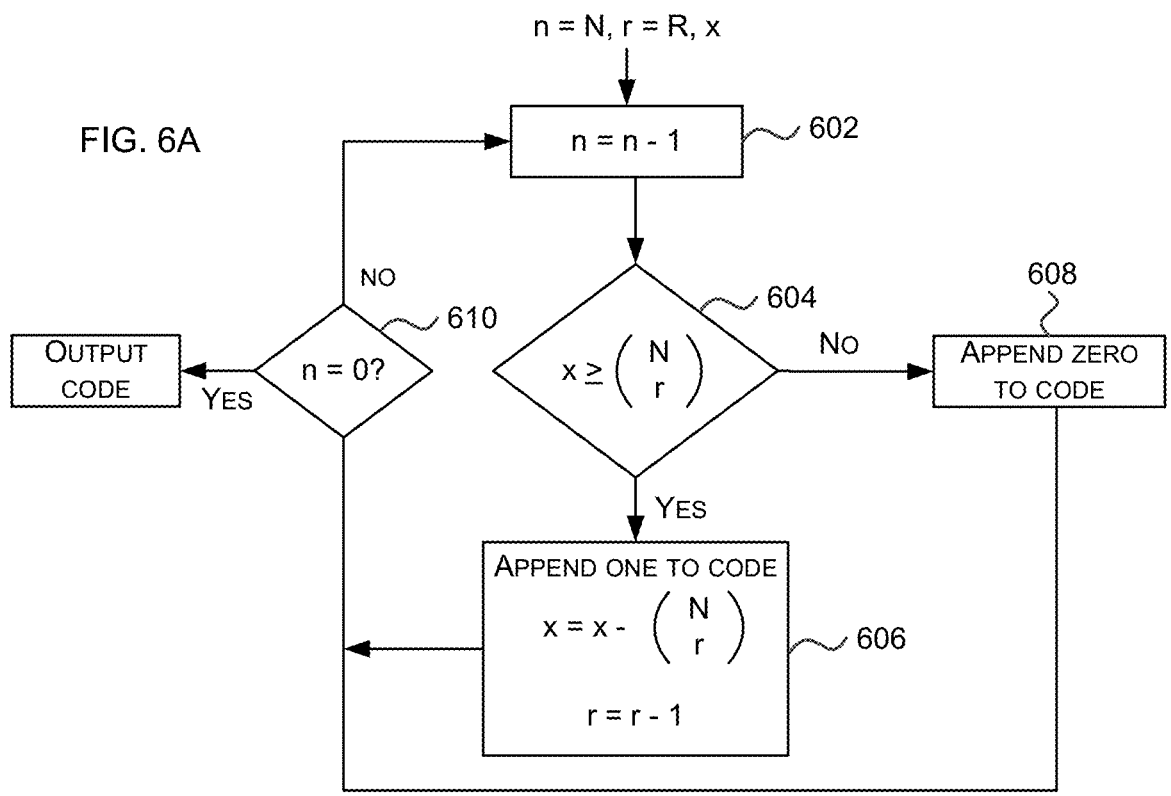
FIGS. 6A and 6B are flow diagrams showing two example methods of generating a code.

The codes within each subset may be stored in a LUT and selected based on the final updated value of the probability index, x, or alternatively, the code may be generated in an iterative process, one bit at a time, using the final updated value of the probability index, x. This iterative method, which is shown in FIG. 6A, may be particularly suited to values of N where the number of codes is sufficiently large such that storing them all in a LUT is inefficient or impractical, however it may also be used for other, smaller values of N (i.e. for any value of N). As shown in FIG. 6A, the iterative method uses two iterating values, n and r, and initially n=N (where, as detailed above, N is the bit length of the code) and r=R (where, as described above, R is the HW of the identified subset) and at the start of each iteration n is decremented by one (block 602) such that there are exactly N iterations. In each iteration, the updated probability index, x, is compared to the binomial coefficient $$\binom{n}{r}$$

with the current values or n and r (block 604). If the updated probability index, x, is greater than or equal to the binomial coefficient $$\binom{n}{r}$$

('Yes' in block 604), then a one is appended to the code, the value of the binomial coefficient $$\binom{n}{r}$$

is subtracted from the probability index, x and r is decremented by one (block 606). If, however, the updated probability index, x, is not greater than or equal to the binomial coefficient $$\binom{n}{r}$$

('NO' in block 604), then a zero is appended to the code and the values of x and r are not changed (block 608). The method stops when n=0 Yes' in block 610).

The earlier two examples may be used to demonstrate the operation of FIG. 6A. In the first example above, N=10 and the initial value of the probability index is 10 (i.e. x=10), and hence R=1 and the starting value of the probability index for the current subset x=9.

| | x | n | r | $\binom{n}{r}$ | $x \geq \binom{n}{r}$? | Code |
|---|---|---|---|---|---|---|
| 1st iteration | 9 | 9 | 1 | 9 | Yes | 1 |
| 2nd iteration | 0 | 8 | 0 | 1 | No | 10 |
| 3rd iteration | 0 | 7 | 0 | 1 | No | 100 |
| 4th iteration | 0 | 6 | 0 | 1 | No | 1000 |
| 5th iteration | 0 | 5 | 0 | 1 | No | 10000 |
| 6th iteration | 0 | 4 | 0 | 1 | No | 100000 |
| 7th iteration | 0 | 3 | 0 | 1 | No | 1000000 |
| 8th iteration | 0 | 2 | 0 | 1 | No | 10000000 |
| 9th iteration | 0 | 1 | 0 | 1 | No | 100000000 |
| 10th iteration | 0 | 0 | 0 | 1 | No | 1000000000 |

In the second example above, N=10 and the initial value of the probability index is 37 (i.e. x=37), and hence R=2 and the starting value of the probability index for the current subset x=26.

| | x | n | r | $\binom{n}{r}$ | $x \geq \binom{n}{r}$? | Code |
|---|---|---|---|---|---|---|
| 1st iteration | 26 | 9 | 2 | 36 | No | 0 |
| 2nd iteration | 26 | 8 | 2 | 28 | No | 00 |
| 3rd iteration | 26 | 7 | 2 | 21 | Yes | 001 |
| 4th iteration | 5 | 6 | 1 | 6 | No | 0010 |
| 5th iteration | 5 | 5 | 1 | 5 | Yes | 00101 |
| 6th iteration | 0 | 4 | 0 | 1 | No | 001010 |
| 7th iteration | 0 | 3 | 0 | 1 | No | 0010100 |
| 8th iteration | 0 | 2 | 0 | 1 | No | 00101000 |
| 9th iteration | 0 | 1 | 0 | 1 | No | 001010000 |
| 10th iteration | 0 | 0 | 0 | 1 | No | 0010100000 |

Figures 7, 8A:
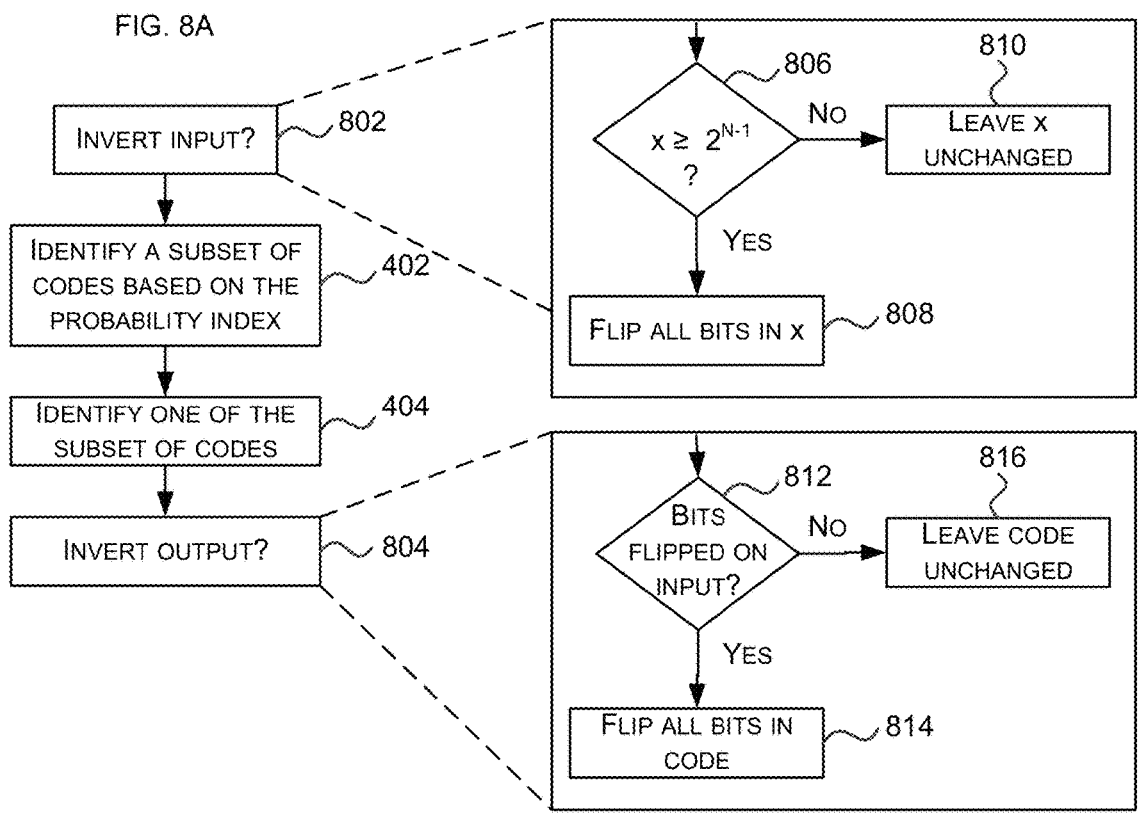

An alternative representation of the method of FIG. 6A is shown in FIG. 7. The table in FIG. 7 encodes the entire method and is shown for N=10, with the columns corresponding to the position of the current bit being determined, i.e. the current value of n (after the initial decrement), and hence there are N columns numbered from 0 to 9. The index 0 corresponds to the LSB and index N−1 corresponds to the MSB. The rows correspond to the number of ones yet to be appended, i.e. the current value of r. There may be N+1 rows; however where the number of bits in the code, N, is equal to the number of bits in the input value, L, a pre-processing operation (which may also be referred to as an input optimization), as described below, may be used to approximately halve the number of rows (a reduction from N+1 rows to ⌈(N+1)/2⌉ rows) and hence the rows are numbered 0 to 5. The values in bold are the binomial coefficients $$\binom{n}{r}$$

corresponding to the column number, n, and row number, r. The 1s and 0s between the binomial coefficients indicate which bit value is appended to the code at each step.

The process operates from right to left, starting at the right-most column (n=N−1=9 in the example shown) and in the row given by the Hamming Weight of the identified subset, i.e. where r=R (e.g. r=R=2 in the example shown). If the current value of the updated probability index, x, is greater than or equal to the current binomial coefficient $$\binom{n}{r}$$

then the updated probability index, x, is reduced by the value of the binomial coefficient and both n and r are decremented by one—this corresponds to a step diagonally left and up to the next binomial coefficient and as indicated in the table, a one is appended to the code. If the current value of the updated probability index, x, is not greater than or equal to the current binomial coefficient $$\binom{n}{r}$$

then the updated probability index, x, is unaltered and only n is decremented by one—this corresponds to a step left to the next binomial coefficient and as indicated in the table, a zero is appended to the code. As comparing always return true, the greyed out values in the bottom left of the table in FIG. 7 are never reached—a code with a Hamming Weight, R, must have R ones in it and this is not possible once n, the number of bits still to be appended, becomes less than r, the number of ones still to be appended.

An example path for the second example above (i.e. for N=10 and the initial value of the probability index is x=37, and hence R=2 and the starting value of the probability index for the current subset, which may also be referred to as the modified or updated value of the probability index is x=26) is indicated by the shaded cells in FIG. 7. A pair of shaded cells corresponds to a binomial coefficient (shown in bold) to be compared against the current value of x, coupled with a subsequent bit selection, 1 or 0, based on this comparison.

In hardware, the loops in the logic of FIG. 5A, FIG. 5B, FIG. 6A and FIG. 6B may be unrolled, i.e. each step of the loop may be placed one after the other sequentially, and/or pipelined in order to trade off latency for area.

As described above, where N=L, a pre-processing operation which occurs as part of the mapping operation (in block 204) and after the probability sorting (in block 202), in combination with a corresponding post-processing operation (also in block 204), may be used to reduce the size of the table shown in FIG. 7 and may in addition, or instead, be used to reduce the size of some or all of the LUTs that are used within the mapping operation. This pre- and post-processing pair of operations may be particularly useful for larger values of N because whilst use of a LUT of some form may result in smaller mapping hardware logic and faster operation for smaller values of N, as the value of N increases, the size of the LUT increases. The number of bits required to store the table increases cubically with N.

FIG. 8A shows an example implementation of the mapping operation (in block 204) that adds a pre- and post-processing pair of operations (blocks 802 and 804) to the method of FIG. 4 (as described above). In the pre-processing stage (block 802), it is determined whether to invert the input, i.e. the probability index (as determined in block 202). If the value of the probability index, x, is in the top half of the range, i.e. $x \geq 2^{N-1}$ ('Yes' in block 806), then all the bits in the probability index are flipped, i.e. zeros are changed to ones and ones are changed to zeros (block 808). However, if the probability index, x, is not in the top half of the range ('No' in block 806), i.e. it is in the bottom half of the range, then the probability index is left unchanged (block 810). The determination of whether the probability index, x, is in the top half of the range (in block 806) may be implemented by inspecting the MSB of the probability index when written in binary. If it is a one then the value is in the top half of the range, whereas if it a zero, then it is not. This means that the decision in block 806 and subsequent processing blocks (blocks 808-810) are equivalent to block 824 (described below).

The mapping then continues as described above with reference to FIG. 4, by first identifying a subset of codes based on the probability index (block 402), where each subset corresponds to a different HW and comprises only those codes from the set of codes with the particular HW, and then selecting one of the codes in the identified subset of codes (block 404).

Having selected a code (in block 404), the post-processing stage (block 804) determines whether to invert that code. If the input probability index was inverted ('Yes' in block 812), then all the bits in the selected code are flipped before the code is output (block 814); however if the input probability index was not inverted ('No' in block 812), then the selected code is output or left unchanged (block 816). This method of FIG. 8A may be implemented using a single flag bit that is set dependent upon whether the input is inverted or not (in block 802) and then used to decide (in block 812) whether to modify the code before it is output. Once the code has been generated (in block 804), the flag bit no longer needs to be stored and can be discarded.

The branching within the method of FIG. 8A (in blocks 802 and 804) may be eliminated as shown in FIG. 8B. FIG. 8B shows another example implementation of the mapping operation (in block 204) that adds a pre- and post-processing pair of operations (blocks 802 and 804) to the method of FIG. 4 (as described above). As shown in FIG. 8B, the MSB of x is extracted (block 822) and XORed with the remaining bits of x (block 824). These modified bits of x (i.e. the output of the XORing operation of block 824) are then used to generate the code (in blocks 402-404) and the MSB of x (as extracted in block 822) is stored as the flag (block 826). Having selected a code (in block 404) using the modified bits of x, the stored MSB is accessed (block 832) and XORed with the selected code (block 834). The result of this second XOR operation (in block 834) is then output. This means that a different set of bits are used to identify a subset of codes (i.e. that are input to block 402) dependent upon whether the method of FIG. 8A or the method of FIG. 8B is used; however, this difference does not affect the outcome.

In the method of FIG. 8A, the flag is stored separately to the input bits as a direct signal/wire from block 806 to block 812. All bits of the input (after pre-processing in block 802) are given as input to block 402, however the MSB is always set to zero, so it contains no information and does not affect the identification of the subset of codes (in block 402). In contrast, in the method of FIG. 8B, after XORing (in block 824), the flag is left as the MSB and the remaining N−1 bits are used as input (with an implicit leading zero) to block 402.

Use of this pre- and post-processing pair of operations (blocks 802 and 804) significantly reduces the number of binomial coefficients required where N=L and hence provides an optimisation of the method of FIG. 4. For example, where N=L and this pair of operations is not used, there are N+1 options for R and hence a LUT that stores the binomial coefficients comprises N+1 rows (and hence (N+1)*(N+1) entries). In contrast, where this pair of operations is used, there are only $\lceil(N+1)/2\rceil$ options for R and hence a LUT that stores the binomial coefficients comprises $\lceil(N+1)/2\rceil$ rows (and hence (N+1)*$\lceil(N+1)/2\rceil$ entries). Where there is some padding, i.e. N>L, there are at most $\lceil(N+1)/2\rceil$ options for R and hence a LUT that stores the binomial coefficients comprises $\lceil(N+1)/2\rceil$ rows. By eliminating the first two rows and columns as described above, the size of the LUT may be reduced. In all cases the number of bits required to store the table is $O(N^3)$. Whilst this optimization may be used where N>L, it provides no benefit, as when N>L, x is never in the top half of all values (e.g. it is always 'No' in block 806 and the MSB of x is always zero, so the XORing operations in blocks 824 and 834 have no effect on the values).

FIG. 9 shows a variation on the method of FIG. 2 which includes a pre-processing operation (block 902) that may be implemented before probability sorting (in block 202) in examples where one or more input values are grouped into a data word. The pre-processing operation (in block 902) is a decorrelation operation that aims to remove, or at least reduce, similarities between the input values in the same data word, e.g. to remove or reduce spatial or channel correlation. In this variation, the input values that are used to determine the probability indices (in block 202) are the modified (i.e. decorrelated) input values output from the decorrelation operation (in block 902).

There are many different ways to perform the decorrelation (in block 902) and the method used may be selected dependent upon the type of input values (i.e. what type of data it is, e.g. whether it is natural video data, video game data, GUI data, etc. and this may be reflected in the data format as YUV is more likely to be used for natural video data whereas RGB is more likely to be used for video games and GUIs). In a system that uses one of a number of different decorrelation methods dependent upon data type (or other criteria), one or more free bits (e.g. one or more of the padding bits) may be used to indicate the decorrelation method used. For some data types, such as those with more saturated values (e.g. saturated videos) the decorrelation (in block 902) may be omitted (as in FIG. 2). Similarly, for formats with an empty channel or alpha (e.g. RGBX or RGBA), the decorrelation operation (in block 902) may be omitted for the extra channel (as in FIG. 2), otherwise the decorrelation may introduce extra information.

In various examples, decorrelation (in block 902) is performed by taking differences between each value and a chosen reference value and this method may be suited to data that has fewer extreme values, e.g. less saturated values (i.e. less extreme values) such as natural video data. The reference value may be a fixed constant or may, for example, be calculated based on the input values in the word (e.g. the mean of the input values) or it may be determined in another way. In some examples, the reference value may be selected from the input values within a data word. For example, if a data word comprises K input values, then the reference value may be specified to be the input value with an index $J=\lfloor K/2\rfloor$ (i.e. the middle index). In other examples, the reference index, J, may be selected as a fixed constant for a particular format of input values and stored in the system or otherwise set as a default value. For example, for 3 or 4 value image formats (e.g. RGB, RGBX, RGBA or planar Y/U/V) the reference index J may be set to 1—this corresponds to both green (which is the most significant colour) as well as a middle value. In any example where the index of the reference value (or the reference value itself if it is calculated rather than selected using an index) varies between words, then bits identifying the reference value choice (e.g. the value of the index or the reference value itself) may need to be stored (e.g. in padding bits). Consequently, use of a fixed (and hence default) value of the reference index J may provide a simpler implementation.

Having identified or selected the reference value in some way, the reference value is subtracted, modulo $2^L$, from every input value in the data word if it is a fixed constant or stored in the padding bits, or from every other input value in the data word if it is given by an indexed value in the word. In the latter case a fixed constant may be subtracted, modulo $2^L$, from the reference value itself, e.g. $2^{L-1}$ may be subtracted when the input values are distributed about the average value (e.g. for YUV data).

For large values of L, a wavelet (e.g. Haar or linear) may be applied to perform the decorrelation or some other, more complex, linear or affine decorrelations may be used, composed of linear maps and/or shifts, as long as the mappings are invertible (i.e. non-singular linear of affine transforms).

For example, given values that range from 0 to 1023 and a data word comprising three 10-bit values 485, 480 and 461 (K=3, L=10), then the binary representation of the word is 0111100101011110000011001101 which has a Hamming Weight of 16. The reference index is specified as $J=\lfloor K/2\rfloor=1$ and hence the value 480 is the reference value. The reference value 480 is subtracted, modulo 1024, from 485 and 461 and the median value 512 (given the range of values 0-1023) is subtracted from the reference value 480. The three values are therefore mapped (in block 902) from 485, 480, 461 to 5, 992, 1005.

As well as using the above decorrelation method on fixed-point values, a decorrelation operation may also be used on floating-point values so long as care is taken with regards to the sign bit and that the operation is lossless, i.e. invertible. In an example, the decorrelation may comprise XORing each value by its sign-bit to align 0 next to minus 0 and to distribute the negative values below the positive values in decreasing order, when considering all values modulo 2L. After this, some of the values may be subtracted modulo $2^L$ from the reference value just as for fixed point decorrelation. This effectively performs the operation in a pseudo-logarithmic space as the exponent, in the MSBs, is treated linearly, but still aims to distribute the transformed inputs around 0. If any of the input values in the word already represent signed (rather than unsigned) values, then decorrelation is generally not required on those values as they are assumed to be distributed about 0 already.

Figure 10A:
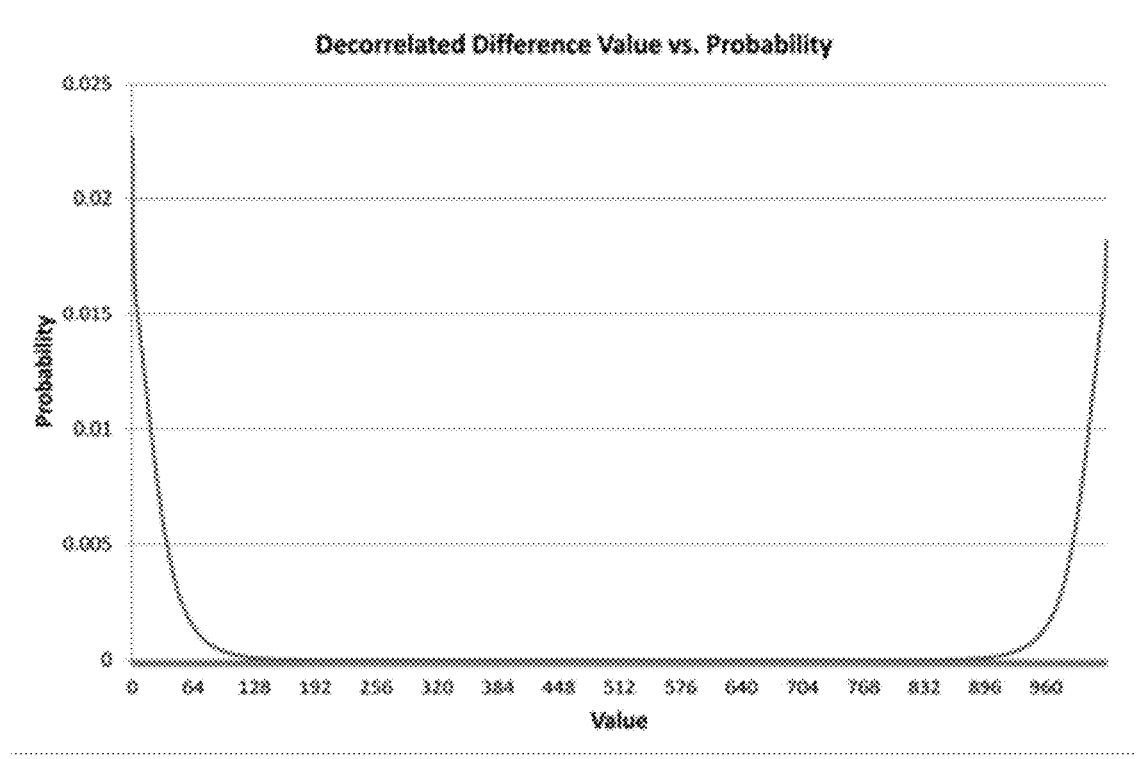
FIG. 10A shows a graph of the probability distribution of example difference values.
Figure 10B:
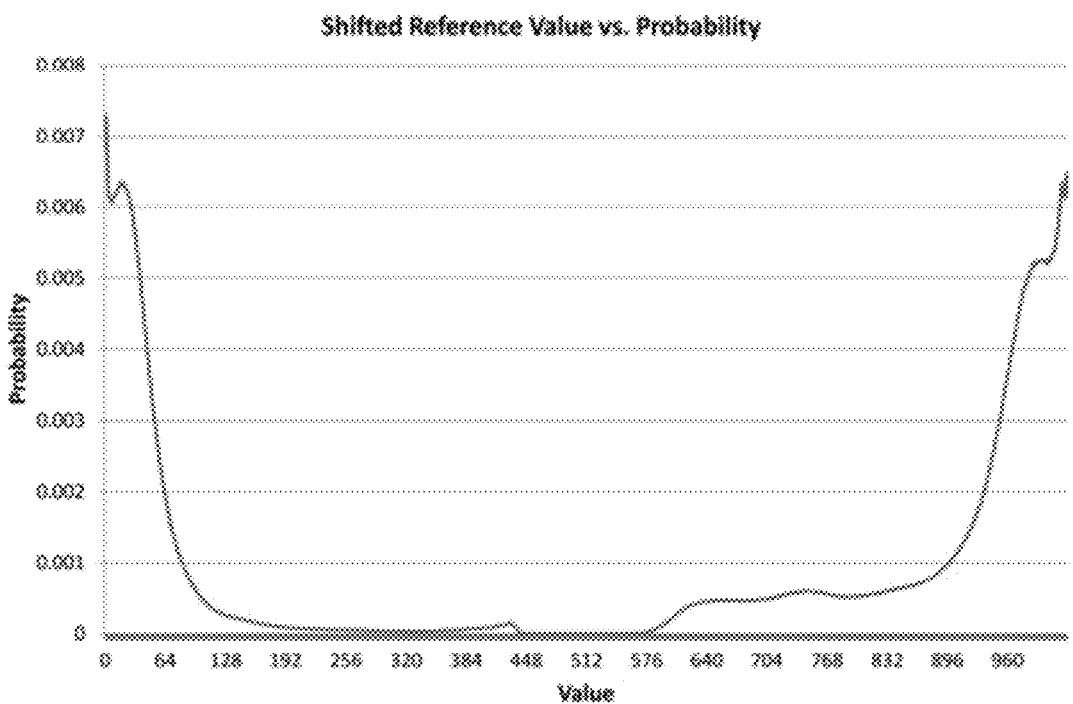
FIG. 10B shows a graph of the probability distribution of example shifted reference values.
Figure 11A:
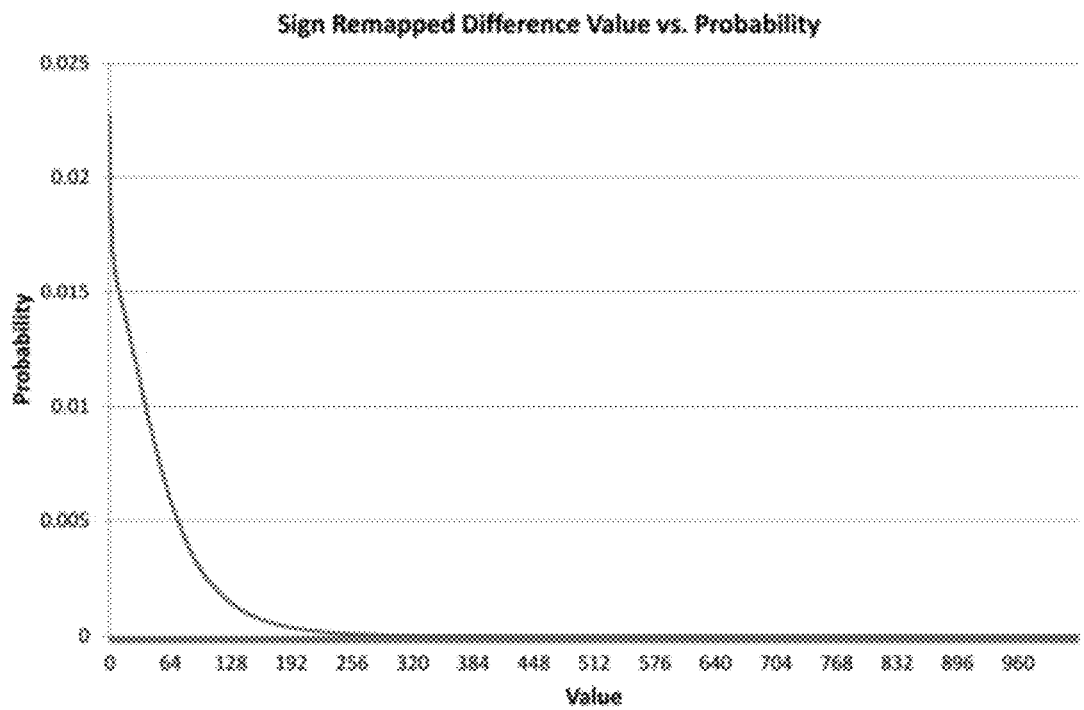
FIG. 11A shows a graph of the probability distribution of sign remapped example difference values.
Figure 11B:
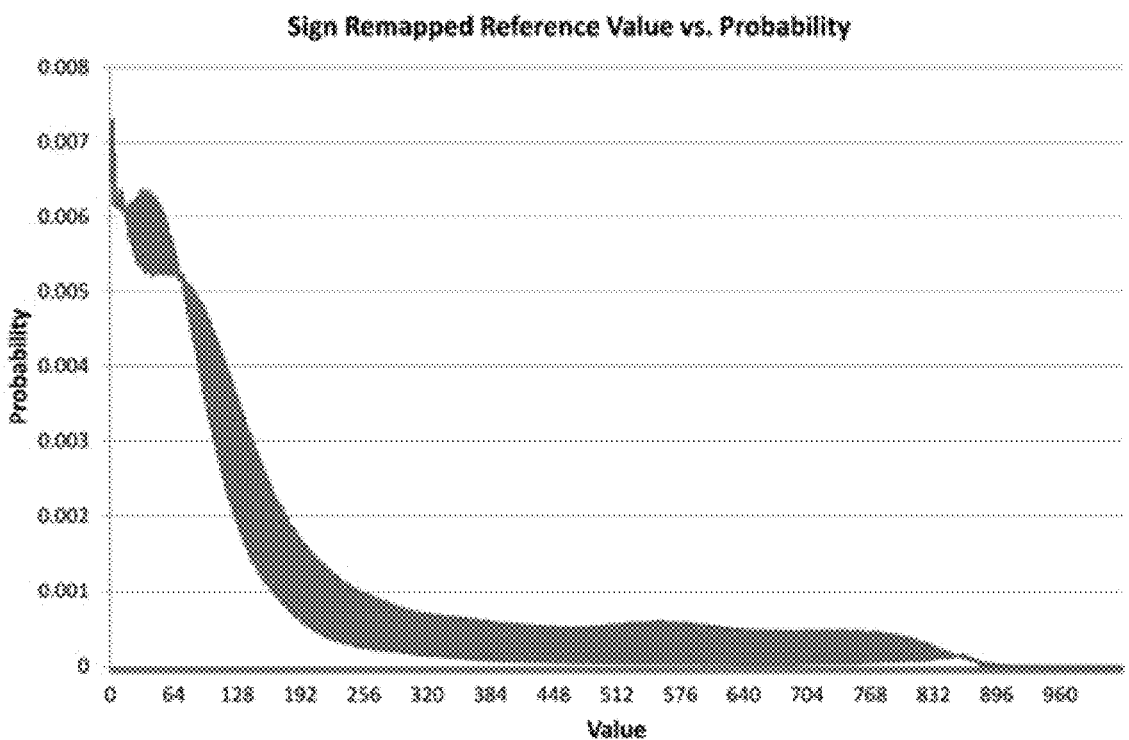
FIG. 11B shows a graph of the probability distribution of sign remapped example shifted reference values.

FIGS. 10A and 10B show graphs of the probability distribution of the decorrelated input values (as output from block 902) for words of either all Y, all U, all V or a mix of U and V data. FIG. 10A shows the probability distribution of the difference values, i.e. for the decorrelated input values which are not the reference value, and FIG. 10B shows the probability distribution of the shifted reference values. In both cases, the decorrelated values are distributed around zero and hence sign remapping may be used to perform probability sorting (in block 202), as described above. The sign remapping maps the three values 5, 992, 1005 to 10, 63 and 37 and in this example, as is often the case, the transformed reference value is largest as it is not as tightly distributed about the average value as the differences are about zero (as shown in FIGS. 10A and 10B). This is further shown in FIGS. 11A and 11B which show graphs of the probability distributions of the sign remapped difference values (in FIG. 11A) and the sign remapped reference values (in FIG. 11B the thickness of the line is a consequence of imperfect ordering which leads to small scale variations in the probability, as opposed to the neatly decreasing probability as is the case in FIG. 11A), again for Y, U or V data.

Figure 12:
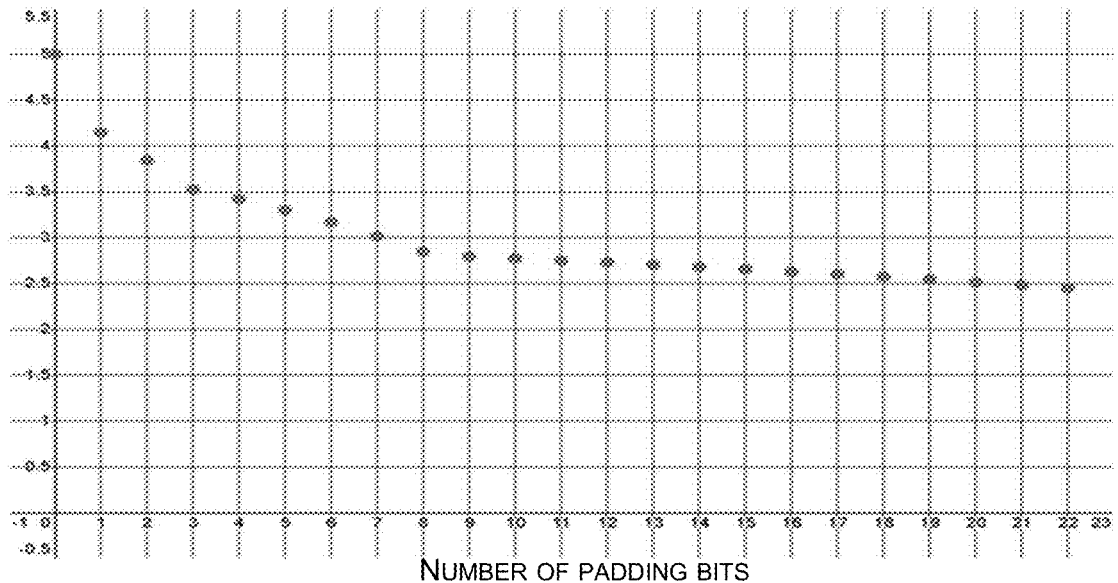
FIG. 12 shows a graph of the average Hamming Weight for a set of uniformly random L-bit input values (where L=10) mapped to the first $2^L$ N-bit binomial codes with P bits of padding, for various values of P.

In the examples described above N=L=10, if N<L then the codes will be lossy so a value of N is used that is greater than or equal to L. In other examples, however, one or more padding bits may be utilised, e.g. to allow for longer codes, such that N>L and N=L+P, where P is the number of padding bits used for the encoding of an input value. As described above, in various examples the data words may include one or more padding bits, in addition to the plurality of input values, e.g. YUV and RGB data values may be packed into 32-bit data words comprising three input values along with 2 or 8 padding bits respectively and one or more of these padding bits may be utilised when encoding one or more of the input values in the data word. Whilst the method would still work where the value of N was much larger than L (e.g. N=2L), this may increase the complexity whilst providing a smaller increase in the efficiency of the codes. This is shown in FIG. 12 which is a graph plotting the average Hamming Weight for a set of uniformly random L-bit input values (where L=10) mapped to the first $2^L$ N-bit binomial codes with P bits of padding, for various values of P, where N=L+P. The horizontal axis represents the numbers of padding bits P (from 0 to 22), and the vertical axis represents the average HW for the first $2^L$ N-bit codes. As shown in FIG. 12, the average Hamming Weight for P=0 is 5 as expected, as with no padding the mean number of 1s is given by half of the L=10 bits. The average HW decreases from 5 down to around 2.5 for P between 0 and 22, with the gradient tailing off to zero. This visually demonstrates that most benefit is gained by adding the first few bits of padding. Gains in performance can be made for P up to $2^L-L-1$, at which point the average HW is $(2^L-1)/2^L \sim 1$, however in many examples N<2L otherwise N≥2L and, in that case, the codes could be stored with half the number of bits, a simpler optimisation.

In various examples, one or more padding bits may be used when encoding the reference value and no padding bits may be used when encoding the difference values. This is because, as shown in FIG. 10B, the probability distribution of the shifted reference values is not as tightly distributed around zero as the difference values. Referring to the earlier example, where the data word comprises three 10-bit input values (K=3, L=10), there may be two padding bits (forming a 32-bit data word) and these two padding bits may be used to encode the reference value such that for the first and third input values the resultant code comprises 10 bits ($N_0=N_2=10$) and for the second input value the resultant code comprises 12 bits ($N_1=12$). In the example above the input values 485, 480, 461 are decorrelated (in block 902) to give 5, 992, 1005 and these are then sign remapped (in block 202) to generate three probability indices: $x_0=10$, $x_1=63$ and $x_2=37$. These may then be mapped to codes (in block 204) by identifying the subset of codes (in block 402) using the method of FIG. 5A, such that $R_0=1$, $R_1=2$ and $R_2=2$ and the updated probability indices are $x_0=9$, $x_1=50$ and $x_2=26$ and then either using a LUT or the method of FIG. 6A to identify (or generate) a code with the specified Hamming Weight. The resultant codes are 1000000000, 010000100000 and 0010100000.

Whilst in this example, all the padding bits (e.g. both of the available padding bits for three 10-bit input values packed into a 32-bit data word) are used in the encoding of only one of the input values in the data word, in other examples, the padding bits may be shared between two or more of the input values. For example, where three 8-bit input values are packed into a 32-bit data word, each input value may be mapped to a 10-bit code (N=10) and there may be two unused packing bits or alternatively two input values may be mapped to 10-bit codes and one input value may be mapped to a 12-bit code, such that all the packing bits are used.

Figure 17:
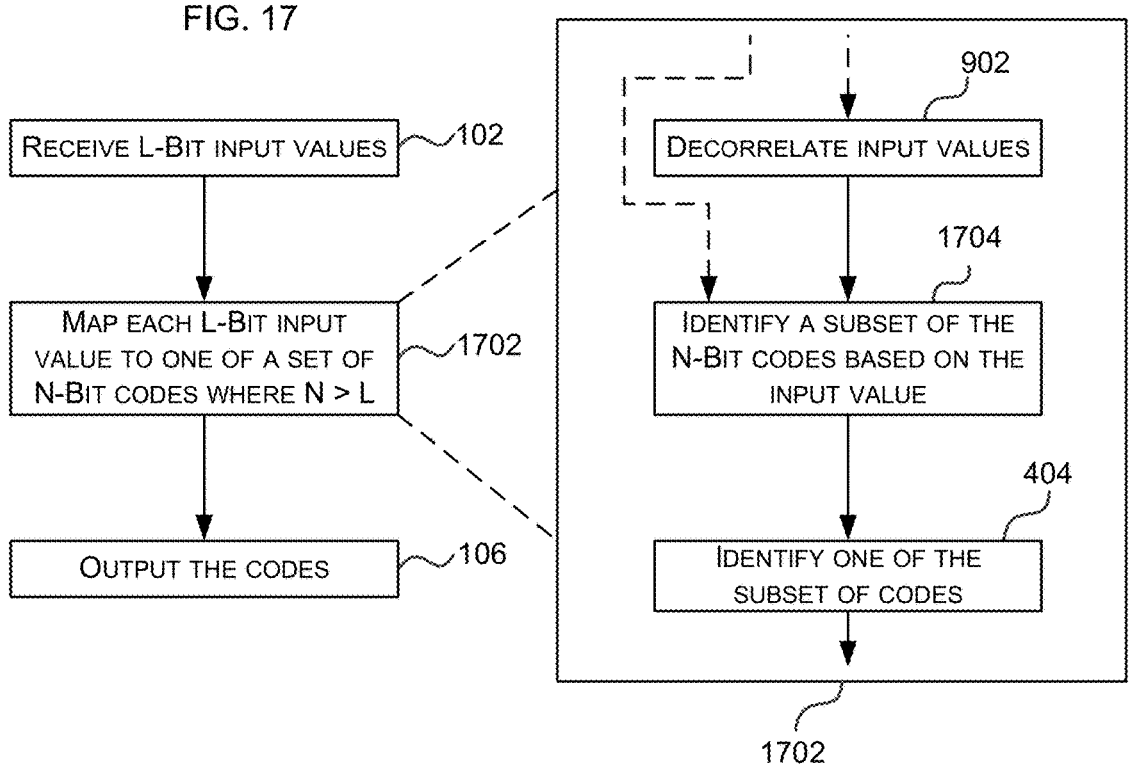
FIG. 17 is a flow diagram of a third example method of power efficient encoding of data.

The methods described above may be used where the input values have a non-uniform probability distribution or where the input values have a uniformly random probability distribution; but, for input values with a uniformly random probability distribution and where N=L, the methods described above may not provide any appreciable benefit in terms of reducing the power consumed when transmitting and/or storing the data. However a variation of the methods described above may be used to reduce the power consumed when transmitting and/or storing the data where there is one or more padding bit (i.e. where N>L) for data that has a uniform probability distribution, e.g. for random data. In such examples, as shown in FIG. 17, instead of mapping input values based on a separately determined probability distribution (as in block 104), the L-bit input values are mapped to N-bit codes, where N>L (block 1702). As part of this mapping operation (in block 1702), instead of determining a separate probability index (as in block 202 for example), the L-bit input value itself is used as the probability index. Alternatively, in the rare occurrence that a decorrelation operation (e.g. in block 902) is used and results in input values with a uniformly random probability distribution, the L-bit value generated from the L-bit input value in the decorrelation operation is used as the probability index. In the method of FIG. 17, the L-bit value is mapped to an N-bit code, where N>L, based on the L-bit input value itself (in block 1702).

In a variation on that shown in FIG. 4 and described above, a subset of codes may be first identified based on the L-bit value (block 1704) and then one of the subset of codes is identified (block 404). This may be done using a LUT (e.g. as described above, for example with reference to FIG. 3) and/or using an iterative process (e.g. as described above with reference to FIG. 6). As a consequence of the grouping and ordering of the N-bit codes based on their HW (as detailed above), the random input value data is mapped to most power-efficient subset of codes. Whilst FIG. 17 does not show the optional pair of pre- and post-processing operations of FIGS. 8A and 8B (blocks 802 and 804), these may also be used where the input data values have no probability distribution (e.g. for substantially random input data).

As described above, in some examples (irrespective of whether the data has a non-uniform probability distribution or is substantially random), multiple input values may be grouped into a data word. In such examples, the resultant codes (one for each input value) may be grouped (e.g. multiplexed) into the output data word in any order, as the order does not affect the HW of the output word. For example, where, as in the example above, the resultant codes are 1000000000, 010000100000 and 0010100000, the code generated by the reference value may be packed at the end of the data word as it uses the additional P padding bits as this may simplify the multiplexing of the codes to form the output data word. The resultant output data word, with a Hamming Weight of 5 is given by:

100000000000101000000100000100000

If the biggest factor to saving power is minimising the Hamming Weight of a word, then this output data word may be transmitted over the external bus, e.g. to external memory or to another external module, such as a display controller.

Figure 6B:
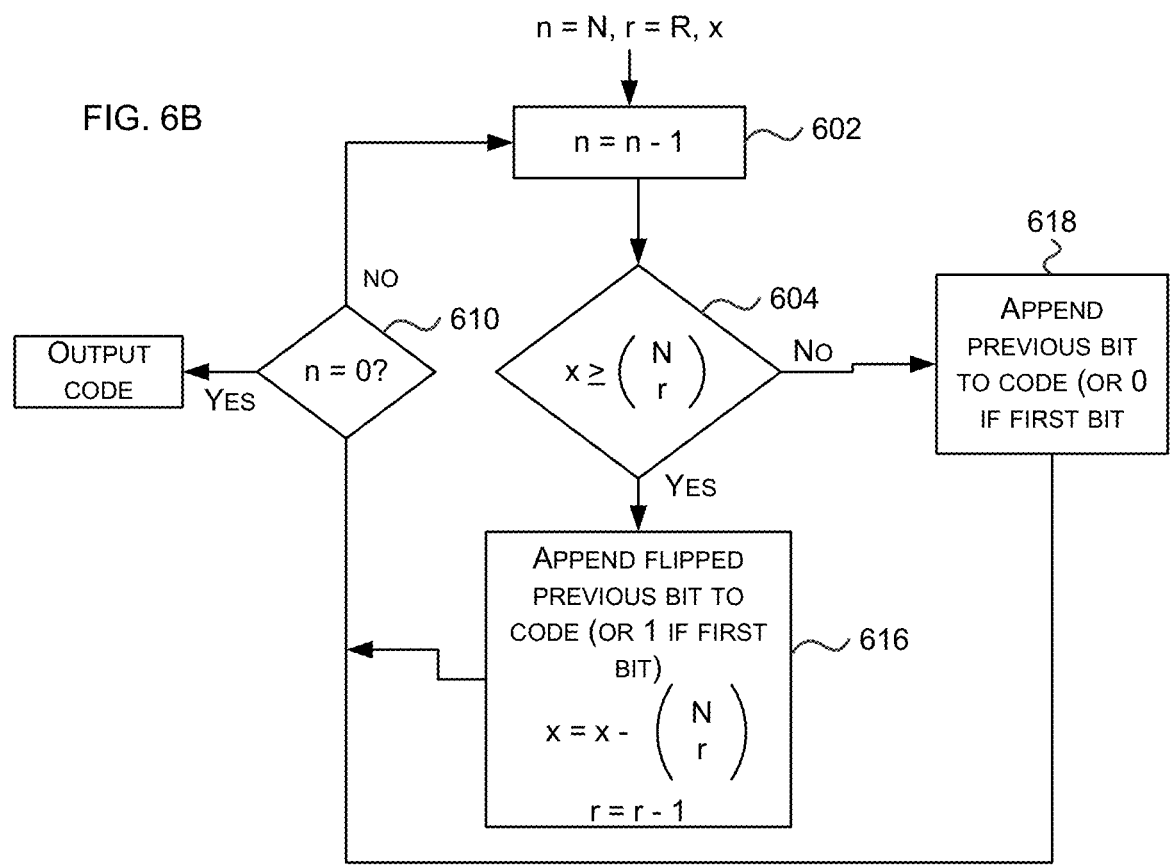
Figure 13:
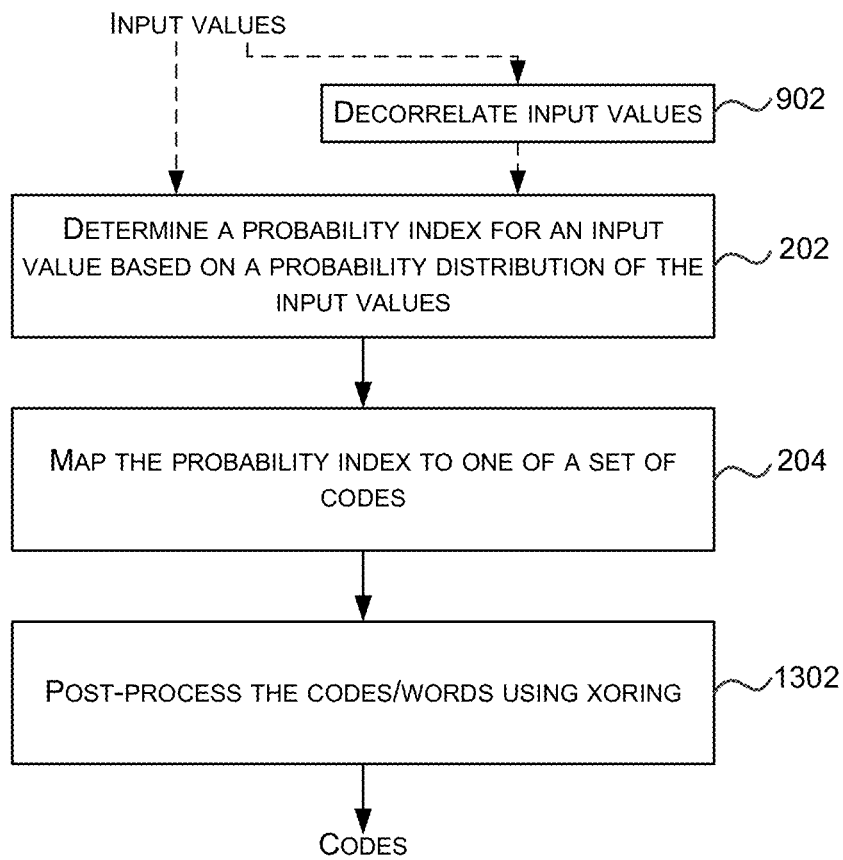
FIG. 13 is a flow diagram showing a further example implementation of the mapping operation of the method of FIG. 1.

If, however, the bigger factor to saving power when transmitting over the external bus is minimising the number of bit flips, then the same methods as described above may be used and an additional post-processing operation (block 1302) may be implemented, as shown in FIG. 13. This post-processing operation (in block 1302) involves an XORing operation, as described below. Whilst FIG. 13 is a variant of the method of FIG. 9, the post-processing operation (of block 1302) may also be used with the method of FIG. 17 and/or the post-processing operation (of block 1302) may be used without any decorrelation (i.e. omitting block 902). Furthermore, this post-processing may be used in conjunction with the optimisations in the methods of FIGS. 8A and 8B. Alternatively, the XORing operation may be performed not as a post-processing operation (as in block 1302), but instead as part of the process of generating the code, as shown in FIG. 6B. As can be seen from FIG. 6B, when compared to the original method shown in FIG. 6A (and described above), for all except the first bit, instead of appending a one (in block 606), the flipped previous bit is appended (block 616) and instead of appending a zero (in block 608), the previous (unflipped) bit is appended (block 618).

In the post-processing operation (block 1302), the code may be treated as a list of differences and each bit (apart from the first) may be XORed with its previous neighbour in turn, where previous may be in either a leftward or rightward direction depending on how the data is transmitted. In the following examples the previous neighbour is to the left and this transforms the code:

100000000000101000000100000100000

Into:

111111111111100111111100000111111

If, however, the codes are transferred in B-bit buses (where B is the bus width), then each bit (apart from each of the first B bits) is XORed not with its previous neighbour but with the bit B places before in turn and in this example the code:

100000000000101000000100000100000 which may be transmitted across a four-bit bus (B=4) as follows:

Lane 0: 10010000 (3 bit flips)
Lane 1: 00000100 (2 bit flips)
Lane 2: 00010010 (4 bit flips)
Lane 3: 00000000 (0 bit flips)

Is transformed into:

10001000100000100010011001000100 which may be transmitted across the four-bit bus as follows:

Lane 0: 11100000 (1 bit flip)
Lane 1: 00000111 (1 bit flip)
Lane 2: 00011100 (2 bit flips)
Lane 3: 00000000 (0 bit flips)

It can be seen that this post-processing reduces the total number of bit flips from 9 to 4.

If the codes are transferred across buses of different widths, i.e. there is not a consistent bus size, B, then the value of B may be chosen to be the highest common factor of all bus sizes. For example, if the previous code (100000000000101000000100000100000) is transmitted over both a 4-bit bus and an 8-bit bus, it is post-processed using B=4 and this post-processing reduces the total number of bit flips over the 4-bit bus (from 9 to 4) and maintains the original number of bit flips (a total of 8) over the 8-bit bus.

Without post-processing:
Lane 0: 1000 (1 bit flip)
Lane 1: 0000 (0 bit flips)
Lane 2: 0001 (1 bit flip)
Lane 3: 0000 (0 bit flips)
Lane 4: 0100 (2 bit flips)
Lane 5: 0010 (2 bit flips)
Lane 6: 0100 (2 bit flips)
Lane 7: 0000 (0 bit flips)

With post-processing:
Lane 0: 1100 (1 bit flip)
Lane 1: 0001 (1 bit flip)
Lane 2: 0010 (2 bit flips)
Lane 3: 0000 (0 bit flips)
Lane 4: 1000 (1 bit flip)
Lane 5: 0011 (1 bit flip)
Lane 6: 0110 (2 bit flips)
Lane 7: 0000 (0 bit flips)

It will be appreciated that this 32 bit example is quite short (in terms of number of bits per lane) and for larger numbers of bits that are more representative of actual implementations, there will usually be a reduction in the number of bit flips over the 8-bit bus as well as the 4-bit bus.

In a further, optional, post-processing operation (in block 1302), if the data is being streamed and access to the previous B bits is available at both the point of encode and the point of decode, then further power savings may be achieved by XORing each of the first B bits with its previous bit in the bit stream and this may improve efficiency by a factor of M/(M−B) where M is the number of bits in the data word (e.g. M=32). In this example at least this final XORing stage is inverted before the encoded data is stored; unless the data will be subsequently read out in the same order in which it was written, e.g. when streaming.

As shown in FIG. 13, the post-processing operation of block 1302 may be used in combination with the decorrelation pre-processing operation of block 902 or may be used independently of the decorrelation operation.

With the exception of the post-processing operation (block 1302) in FIG. 13, many of the methods above are described as operating so as to minimise (or at least reduce) the Hamming Weight (i.e. the number of ones) in the output codes. In these cases the system may be said to have a target value of zero for the Hamming Weights of the output codes. However, there may be implementation scenarios, for example, due to the asymmetries inherent in certain silicon processes, in which transmitting or storing a one is more power efficient than transmitting or storing a zero. In these cases the system may be said to have a target value for the Hamming Weights of the output codes which is a maximum value (and which depends on the length of the codes). When targeting a maximum Hamming Weight the same methods may be used with one additional operation—the flipping of all the bits of the output codes at the end of the method. Alternatively, the above methods may be modified to replace references to zeros to references to ones and vice versa (in blocks 606 and 608 of FIG. 6A, block 2202 of FIG. 22, blocks 2302 and 2307 in FIG. 23 and block 2402 in FIG. 24). The pre- and/or post-processing operations described above with reference to FIGS. 8A, 8B and 9 (e.g. in blocks 802, 804 and 902) may still be used when maximising ones rather than zeros. However, if a similar change was applied to the post-processing operation 1302 (or its equivalent as shown in FIG. 6B) this would instead result in maximising (rather than minimising) bit flips and so this may only be implemented where this is a desired outcome.

In some implementation scenarios, a system may benefit from maximising ones in some instances and maximising zeros in other instances. To enable this, a flag (e.g. a single bit) may be provided that toggles the operation between the variant of the methods that maximises ones and the variant of the methods that maximises zeros.

Figure 14A:
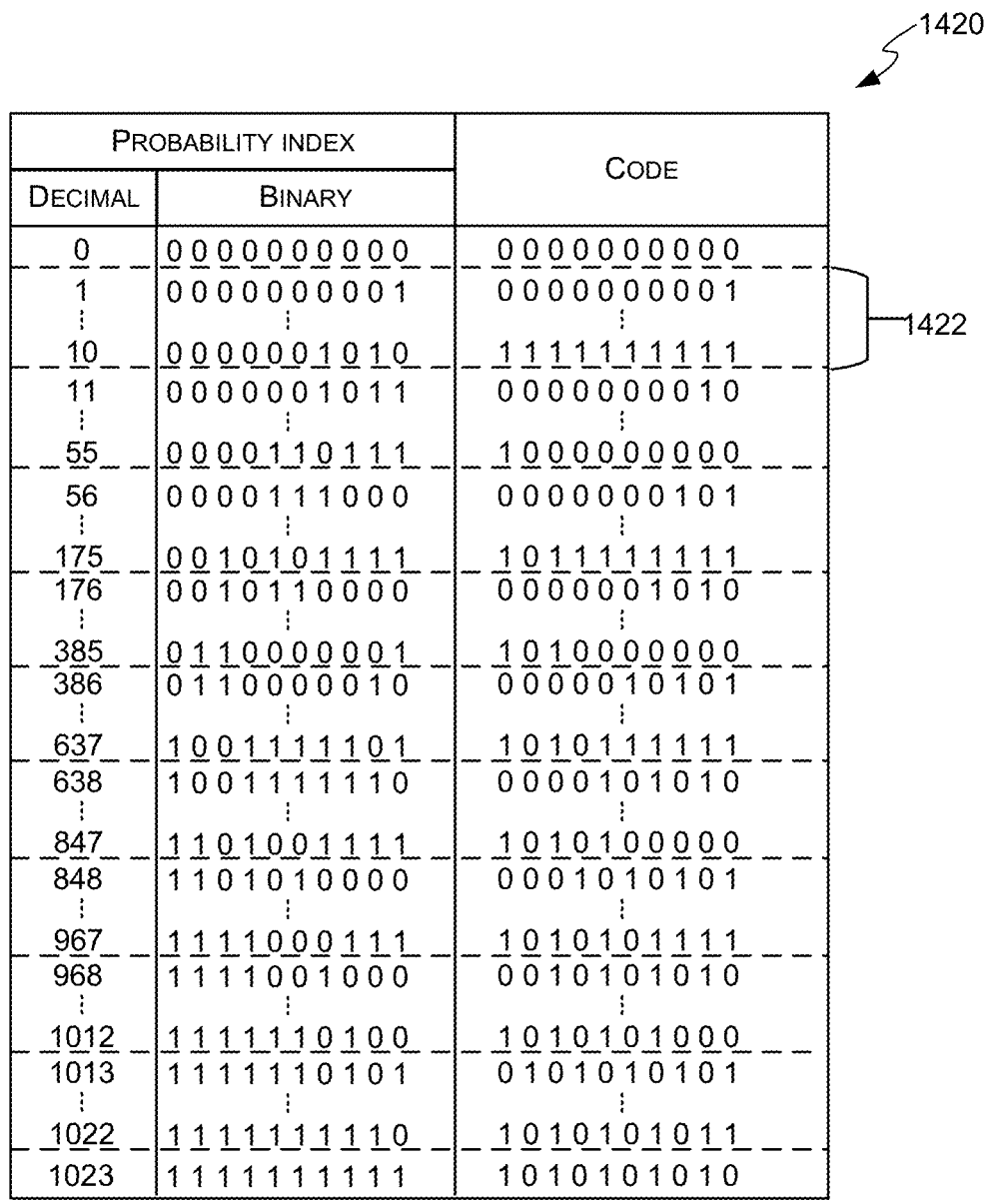

As noted above, in the mapping operation (in block 204) the probability index (and hence the input value) may be mapped to one of a pre-defined set of codes based on a number of ones that are present in the pre-defined codes or based on a number of bit flips that are present in the pre-defined codes. The examples above (except for FIG. 6B and block 1302) all relate to the first of these options (i.e. based on a number of ones); however, the mapping operations described above (including where there is a uniform probability distribution, as in FIG. 17) may also be used where the mapping is performed based on the number of bit flips that are present in the pre-defined codes (i.e. based on the number of transitions between a zero and a one or a one and a zero in two consecutive bits within a code). This, for example, would result in the regrouping of the codes into subsets compared to the LUT 300 of FIG. 3 and hence also a reordering of the codes. The regrouping of codes is, however, now dependent on whether the codes are being streamed or not. If the codes are being streamed, the previous neighbour is available for XORing and every code that begins with a one (either on the left or the right depending on the direction of the stream) indicates an implicit bit flip. An example LUT 1420 is shown in FIG. 14A and this implicit bit flip can be seen from the second subset, subset 1422, that contains codes with one bit flip including code 1111111111. If the codes are not being streamed, then the previous neighbour is not available for XORing and an example LUT 1400 is shown in FIG. 14B.

Figure 15A:
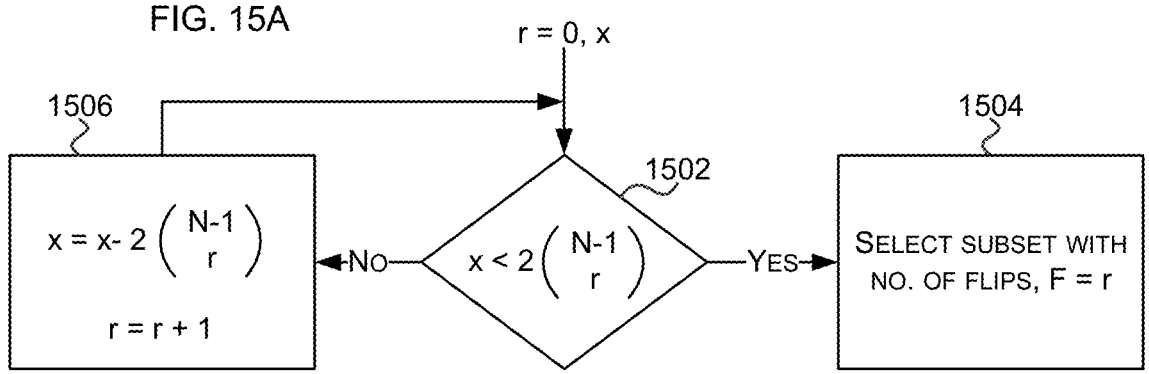
FIGS. 15A and 15B are flow diagrams showing further example methods of identifying a subset of the pre-defined set of codes.
Figure 15B:
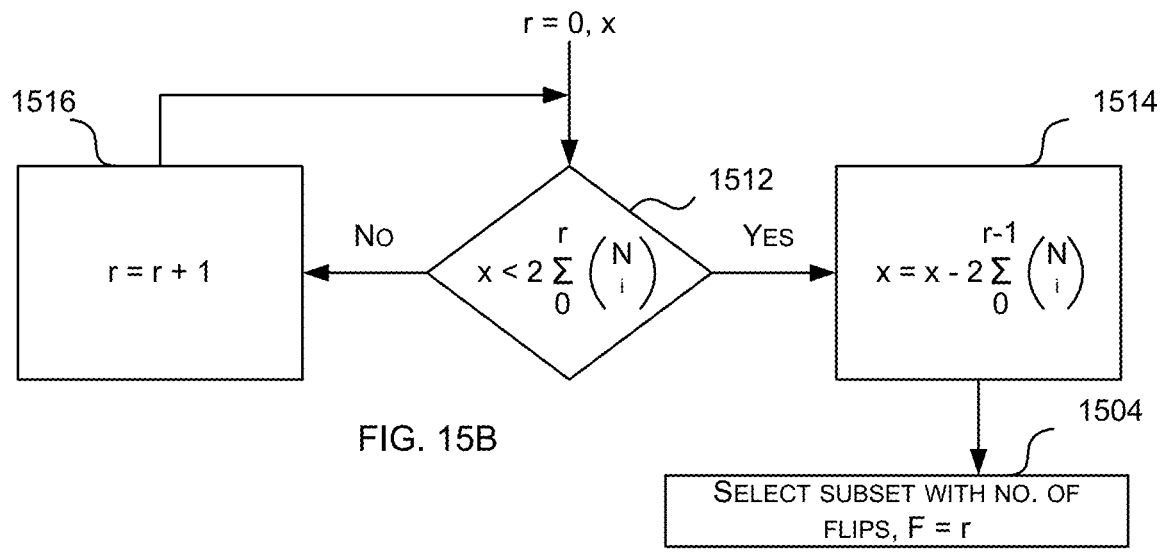

As shown in FIG. 14B, the set, or subset, of 10-bit codes is sub-divided into a plurality of subsets 1401-1410, each comprising two or more codes that contain the same number of flips, e.g. the first subset 1401 comprises the two codes which have no flips, the second subset 1402 comprises the 18 codes which have one flip, etc. Within each subset, the codes with the same number of flips may be ordered in any way and in the example shown they are ordered lexicographically. As shown in FIG. 14B, whilst in a very few cases the 10-bit binary version of the probability index matches the 10-bit code, in the majority of cases the two are different.

Where the number of flips, rather than the HW, is used, the subset of codes may, for example, be identified (in block 402) by iteratively subtracting twice the binomial coefficient $$\binom{N-1}{r}$$

from the probability index, x, where N is the number of bits in the code and initially r=0. FIG. 15A shows the equivalent to FIG. 5A where the number of flips, F, is used instead of the Hamming Weight, R. As shown in FIG. 15A, the probability index, x, is initially compared to twice the binomial coefficient with r=0 (block 1502), which is equal to two (irrespective of the value of N)—as shown in FIG. 15A, the binomial coefficient where the number of flips is used is $$\binom{N-1}{r}$$

and not $$\binom{N}{r}$$

because whilst in an N-bit code there are N bit positions, there are only N−1 points between bits at which flips can occur (unless XORing across adjacent codes occurs, e.g. in streaming in which case the previous method of FIG. 6B, block 1302 or FIG. 14A is used), but the (smaller) binomial coefficient is multiplied by two because there are two options for the value of the initial bit—a one or a zero—and then all other bits are determined by both the number of bit flips and the position of those bit flips. If the probability index is strictly less than two ('Yes' in block 1502), i.e. it is zero or one, then the first subset 1401, with a number of flips, F, of 0, is selected (block 1504). Otherwise, the value of twice the binomial coefficient (i.e. two, in this first iteration) is subtracted from the probability index and the value of r is incremented by one (block 1506). In subsequent iterations, the updated probability index, x, from the previous iteration is compared to twice the binomial coefficient with the current value of r (in block 1502) and if the updated probability index, x is strictly less than twice the binomial coefficient ('Yes' in block 1502), then the subset with number of flips equal to the current value of r is selected, i.e. where F=r (block 1504). If, however, the updated probability index, x is not strictly less than twice the binomial coefficient ('No' in block 1502), then the value of twice the binomial coefficient (with the current value of r) is subtracted from the updated probability index and the value of r is incremented by one (block 1506). The values of the binomial coefficients (or twice those binomial coefficients) that are used in selecting the subset (in blocks 1502 and 1506) may be calculated or may be pre-generated and obtained from a LUT (e.g. in a similar manner as described above with reference to FIG. 5A). Furthermore, in a similar manner to the modification of the method from that shown in FIG. 5A to that shown in FIG. 5B, the method of FIG. 15A may be modified to use a cumulative version of the double binomial coefficients and/ or the values in the LUT may be the cumulative versions to reduce the amount of processing, latency and power (as described above with reference to FIG. 5B), as shown in FIG. 15B. As shown in FIG. 15B, through the use of the cumulative value (in the comparison of block 1512), the update step (block 1516) in the loop only comprises an increment to the value of r (instead of also updating the value of the probability index, as in block 1506 of FIG. 15A) and there is a single subtraction operation that calculates the final, updated value of the probability index x (block 1514). This subtraction operation (in block 1514) subtracts the cumulative value $$2\sum_{i=0}^{i=r-1}\binom{N}{i},$$

which may be read from the LUT, from the original probability index to generate the final, updated version of the probability index in a single step. In a further variation, instead of storing the double binomial coefficients, only the binomial coefficients may be stored in the LUT (i.e. without being multiplied by two) and the multiplication by two may be performed on the fly, i.e. by shifting bits by one bit position.

Figure 22:
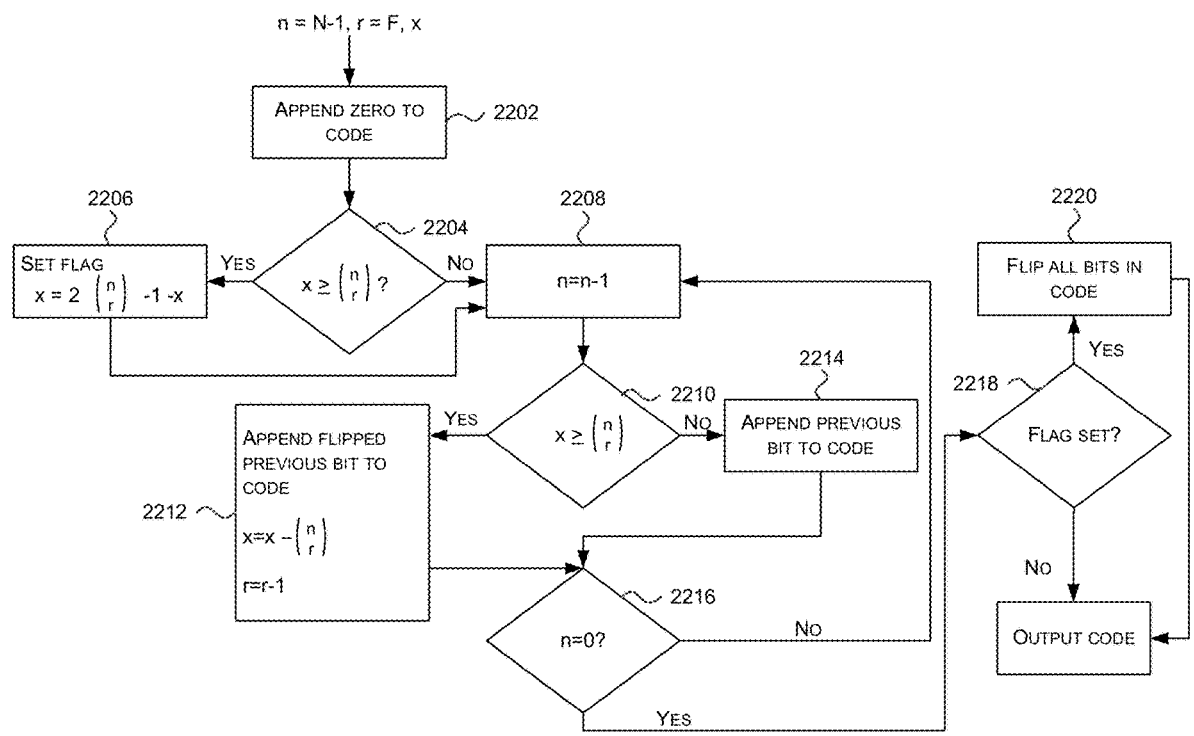
FIG. 22 is a flow diagram showing another example method of generating a code.

Once a subset has been identified (in block 402), for example using one of the methods described above, information determined as part of the identification of the subset may be used to select a code from the identified subset (in block 404), as described earlier. The codes within each subset may be stored in a LUT and selected based on the final updated value of the probability index, x, or alternatively, the code may be generated in an iterative process, one bit at a time, using the final updated value of the probability index, x, as shown in FIG. 22. As shown in FIG. 22, the iterative method uses two iterating values, n and r, and initially n=N−1 (where, as detailed above, N is the bit length of the code) and r=F (where, as described above, F is the number of flips in the identified subset) and, following a pre-processing stage (blocks 2202-2206), n is decremented by one (block 2208) such that there are exactly N−1 iterations (one for each of n=N−2, N−3, . . . , 1, 0).

In the pre-processing stage of the method of FIG. 22, a zero is appended to the code (block 2202) and if the final updated value of the probability index, x, is greater than or equal to the binomial coefficient $$\binom{n}{r}$$

('Yes' in block 2204), a flag is set and the value of the probability index is reduced (block 2206) by setting x equal to $$2\binom{n}{r}-1-x.$$

in each of the subsequent iterations, n is decremented by one (block 2208) and the updated probability index, x, is compared to the binomial coefficient $$\binom{n}{r}$$

with the current values of n and r (block 2210). If the updated probability index, x, is greater than or equal to the binomial coefficient $$\binom{n}{r}$$

('Yes' in block 2210), then a flipped version of the previous bit (i.e. the bit most recently appended to the code) is appended to the code, the value of the binomial coefficient $$\binom{n}{r}$$

is subtracted from the probability index, x and r is decremented by one (block 2212). If, however, the updated probability index, x, is not greater than or equal to the binomial coefficient $$\binom{n}{r}$$

('No' in block 2210), then the previous bit is appended to the code and the values of x and r are not changed (block 2214). The iterative loop stops when n=0 (Yes' in block 2216) and then there is a post-processing stage. In the post-processing stage, if the flag was set in the pre-processing stage (Yes' in block 2218), all the bits in the code are flipped (block 2220). If the flag was not set ('No' in block 2218), the bits in the code are not flipped. This flag may be encoded as a direct signal between block 2206 and 2218, or it may be stored as an additional bit alongside the output code, which is discarded during post-processing.

Figure 23:
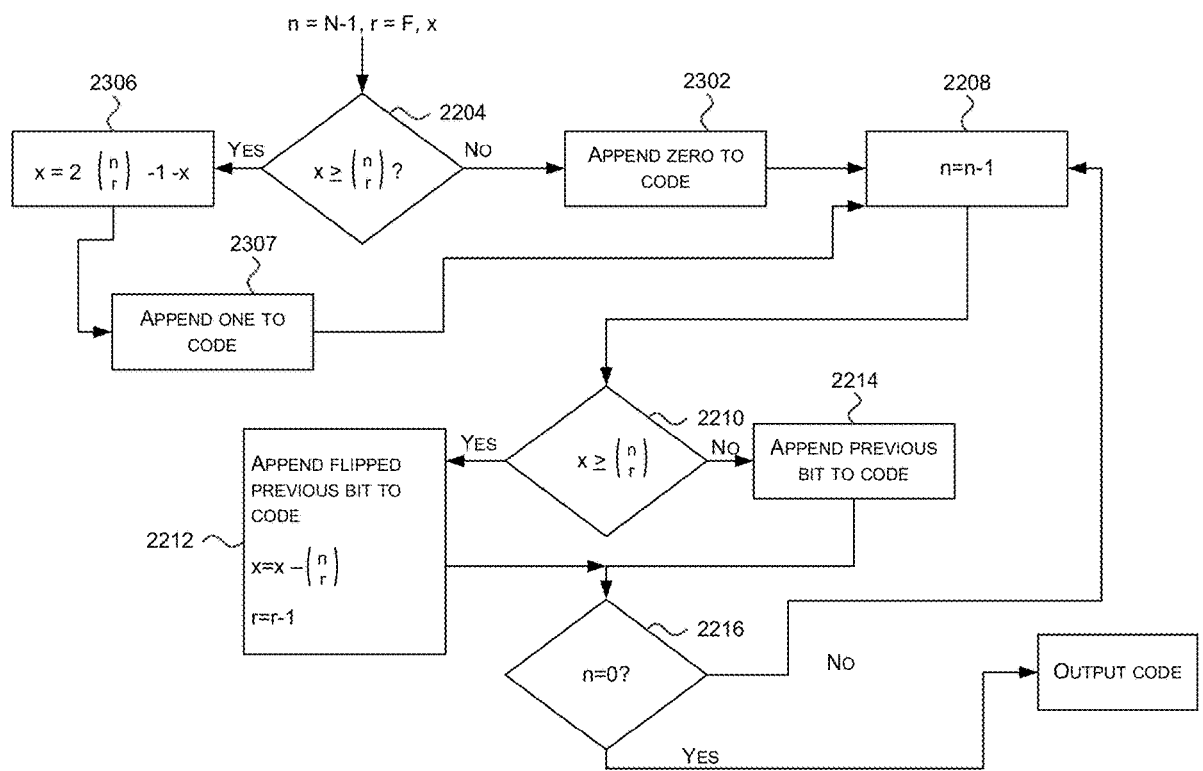
FIG. 23 is a flow diagram showing yet another example method of generating a code.

FIG. 23 shows another iterative method of generating a code which is a variant on that shown in FIG. 22 and described above. Unlike the method of FIG. 22, the method of FIG. 23 avoids the need for a post-processing operation and does not involve the storage of a flag (either as a system state or as an extra bit alongside each code). Consequently, the method of FIG. 23 is more efficient than the method of FIG. 22. As shown in FIG. 23, whether a one or zero is initially appended (in block 2307 or 2302) depends on the result of the first comparison (in block 2204) and by setting up the initial bit of the code in this way, there is no need to flip all the bits in the code dependent upon a stored flag value.

In many of the examples described above, the input values were all of the same length, i.e. L-bits, as well as the length of the output codes, i.e. N-bits. As described above, in various examples the input values and/or output values may vary in length and this may be dependent upon the way in which the input values are generated. In an example, the input values may be generated using Huffman encoding and in a specific example which uses alphabetic symbols and their associated probabilities, these may be encoded by starting, for each input character, with an empty output binary string that is assigned to a leaf node. These leaf nodes are used as the base for building a binary tree. The data is processed by finding at each step the two unprocessed nodes with smallest probability and creating a new node with its probability given by the sum of the previous two. The output binary strings of the first/second previous nodes (and all nodes below it in the hierarchy) have a 0/1 pushed on to the front of their output codes, with the node with the higher probability assigned the 0 and the node with the lower probability assigned the 1 (by assigning 1 and 0 in this way, rather than arbitrarily, results in up to a 9% reduction of the average Hamming Weight in the example below). These two previous nodes are then considered processed and are afterwards ignored when choosing nodes. This is iteratively repeated until only a single unprocessed node remains (called the root node with probability 1). This process builds a binary tree where each newly created node is connected to the two previous nodes that generated it, and where input characters (corresponding to leaf nodes) further down the hierarchy have longer output binary codes assigned to them.

The resulting binary codes are of any number of bits long and so it may be desirable to pad the codes up to a multiple of 4-bits in order to reduce muxing (i.e. multiplexing) logic in the hardware, and such that, in this example, it is desirable to pad every encoded input character up to 4, 8 or 12 bits long. As naively padding the Huffman codes by zeroes affords no gain, e.g. a reduction in HW, the encoded input characters may be used as input to the methods described herein to map them to output codes of 4, 8 or 12 bits in length, which are more power efficient.

The Huffman encoded input characters form the input values to the encoding methods described herein and the probability data that was used in the Huffman encoding may no longer be available for the probability sorting operation (in block 202). Whilst in this case the ordering given by the original probability data is not available, it is implicitly stored in the Huffman-encoded input values from the length and value of the codes, and hence can be inferred from them using a sorting algorithm, for example by performing a repeated pairwise comparison of input values (e.g. bubble or quick sort) to put the input values in order of probability, from highest to lowest: if the two input values have a different length, then the shorter one has a higher probability and if the two values have the same length, then the smallest lexicographically has a higher probability. This may be written, for two input values a and b of length $L_a$ and $L_b$ with unknown probabilities $p_a$ and $p_b$, as:

$$p_a > p_b \leftrightarrow L_a < L_b \vee (L_a = L_b \wedge a < b)$$

Where the final inequality is given by treating the two codes of equal length as $L_a$-bit integers. This sorting, and the subsequent binary codes generation (described below) may be performed offline (rather than on the fly) and used to generate a LUT. At runtime, codes may be identified by indexing into the LUT and at runtime this is more efficient in terms of processing and latency, particularly for large datasets.

Having ordered the input values, and hence implicitly assigned probability indices, as described above, they are mapped to one of the set of pre-defined codes (in block 204) where in this example, the length of the output code for a given input value is the length of the input value rounded up to the next multiple of 4 bits (i.e. 4, 8 or 12 bits). Therefore the output codes meet the requirement of being at nibble stride but also maintain most of the benefits of the variable length entropy encoding.

In order that the codes are prefix-free (i.e. so that the lengths do not need to be stored separately if concatenating) the first 4/8 bits of the 8/12 bit codes must differ from any of the 4/8 bit codes themselves. Consequently, the 8-bit code words may be set to all begin with the same prefix of 1010, which follows on from the least likely 4-bit code word for 'r' of 1001, and all 12-bit code words may be set to begin with 10101101, which follows on from the least likely 8-bit code word for 'k' of 10101011.

For this example the resultant mapping, with the characters ordered according to their probability, is as follows:

| Letter | Input value | Code |
|---|---|---|
| e | 011 | 0000 |
| t | 111 | 0001 |
| a | 0001 | 0010 |
| o | 0010 | 0100 |
| i | 0100 | 1000 |
| n | 0101 | 0011 |
| s | 1000 | 0101 |
| h | 1001 | 0110 |
| r | 1010 | 1001 |
| d | 0000, 0 | 1010, 0000 |
| l | 0000, 1 | 1010, 0001 |
| c | 1011, 0 | 1010, 0010 |
| u | 1011, 1 | 1010, 0100 |
| m | 1100, 0 | 1010, 1000 |
| w | 1100, 1 | 1010, 0011 |
| f | 1101, 0 | 1010, 0101 |
| g | 0011, 00 | 1010, 0110 |
| y | 0011, 01 | 1010, 1001 |
| p | 0011, 10 | 1010, 1010 |
| b | 0011, 11 | 1010, 1100 |
| v | 1101, 11 | 1010, 0111 |
| k | 1101, 100 | 1010, 1011 |
| j | 1101, 1010, 0 | 1010, 1101, 0000 |
| x | 1101, 1010, 1 | 1010, 1101, 0001 |
| q | 1101, 1011, 0 | 1010, 1101, 0010 |
| z | 1101, 1011, 1 | 1010, 1101, 0100 |

It can be seen from this that whilst in some cases the input value and the output code may be the same, in most cases they are different and the average relative HW (i.e. where 'average' indicates summing the relative HWs over all output codes weighted by their associated probabilities and 'relative HW' refers to the HW as a proportion of the code length, which is a better metric for variable length codes than simply the HW) is reduced by more than 15% in the above example compared to padding the original Huffman Codes only and hence this provides a corresponding power saving.

Another example method of power efficient encoding of data can be described with reference to FIG. 16. Whilst the method of FIG. 16 may be used as a post-processing operation to the methods described above, in most examples the method is used independently. Compared to the methods described above, the method of FIG. 16 is simpler to implement but the earlier methods provide improved performance (e.g. larger improvements in power consumption).

Figure 16:
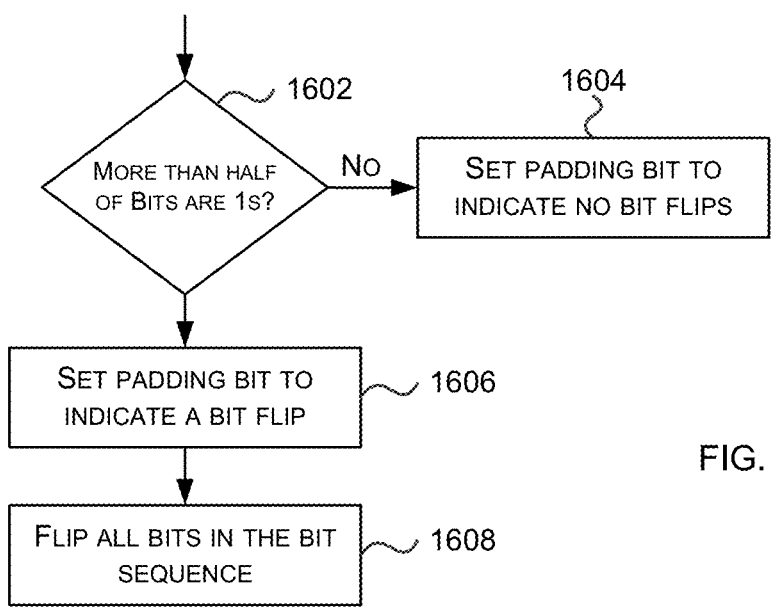
FIG. 16 is a flow diagram of a second example method of power efficient encoding of data.

The method of FIG. 16 may be used to reduce the Hamming Weight of the data that is to be transmitted over an external bus anywhere where there is one or more unused padding bit. By reducing the HW of the data that is transmitted, the power efficiency of the data transmission is improved independently of the width of the buses (which may be internal or external buses) over which the data is sent (e.g. where the bus width is known or where the bus width is not known). This method provides improvements in power efficiency even where the input values have a uniformly random probability distribution and may, for example, be used for the types of data described above or other types of data such as pointer data (e.g. where it is aligned to a particular level of granularity). Unlike known techniques, the method of FIG. 16 does not require any knowledge of bus (or memory row) width or any control of the order of data writes/reads (e.g. where there is caching or write combining performed by hardware).

Whilst the description of the method of FIG. 16 below refers to reducing the Hamming Weight of the data based on a determination of how many (or what proportion of) bits are ones, the method may, more generally, be based on a determination of how many (or what proportion) of bits have a predefined value (e.g. where this is set to one or zero) such that the Hamming Weight is either reduced (where the predefined value is set to one) or increased (where the predefined value is set to one). The choice of predefined value may be dependent on the particular architecture and hardware used.

Where there is one unused padding bit, the method of FIG. 16 may be applied to all the other bits in a data word. In other examples, the other bits in the data word may be subdivided into portions with one of the portions corresponding to the unused padding bit and the method of FIG. 16 may be applied to that portion and not to the other portions. Where there are more than one unused padding bits, the other bits in the data word may be subdivided into portions, with each portion, or a subset of the portions, corresponding to one of the unused padding bits and the method of FIG. 16 may be applied to each portion having a corresponding unused padding bit, independently of the other portions. In various examples, where a data word is subdivided into portions, the portion size may be selected such that each portion has an even bit-length and different portions may, in various examples, have different bit-lengths.

As shown in FIG. 16, the method comprises determining whether the bit sequence (which, as described above may comprise some or all of the bits in the data word apart from the corresponding unused padding bit) comprises more ones than zeros (block 1602) and if there are fewer ones than zeros, or the same number of ones and zeros (No' in block 1602), then the corresponding padding bit is set to a value (e.g. zero) that indicates that the bit sequence has not been flipped (block 1604). In contrast, if there are more ones than zeros in the bit sequence (Yes' in block 1602), then the corresponding padding bit is set to a value (e.g. one) that indicates that the bit sequence has been flipped (block 1606) and all the bits in the bit sequence are flipped, i.e. inverted (block 1608). This therefore reduces the Hamming Weight of the bit sequence that is transmitted over the external bus and caps the maximum Hamming weight to ceil(N/2), where N is the number of bits in the bit sequence including the padding bit.

Whist this method of FIG. 16 may only produce small benefits where the input values rarely have high Hamming Weights (e.g. HW>[N/2]), the method provides larger benefits in examples where the input values frequently have high Hamming Weights. If, for example, the input values represent unsigned integers, the values with high HWs would mainly be the largest values in the set. If, for example, the input values represent signed integers, the values with high HWs would mainly be the smallest negative values. For input values with uniformly random probability, the method provides improved efficiency, but the improvement is less than where the distribution is skewed to higher HWs as each input value has equal probability.

By using the method of FIG. 16 independently of the other methods described herein, the HW of video data may be reduced by up to around 20% dependent on the nature of the video data. In contrast, by using the other methods described herein (e.g. the method of FIG. 1 with the various optional pre- and post-processing stages), the HW of video data may be reduced by over 50% and for some types of video data by as much as 80%.

Whilst not shown in FIG. 16, in various examples, the decorrelation operation (block 902) described above may be used as a pre-processing step to the method of FIG. 16. This provides an additional improvement in the benefits achieved using this method, since the bit-flipping of FIG. 16 makes most improvement on values with high HW, e.g. small negative values.

Whilst the methods above have been described as improving efficiency of data transmission over an external bus and data storage in an external memory, the power efficiency may be improved where the data is transmitted over an internal bus and/or stored in a local cache. In such an example the methods described herein may be implemented at the end of the processing operations that generate the input values, e.g. at the end of processing a tile of graphics data.

The methods described above relate to the encoding of data values. Prior to the use of the encoded data values, and in some examples prior to the storing of the encoded data values, a decoding method may be used to recover the original input values. Decoding the encoded data values generated using any of the methods described herein may be performed by inverting each stage of the method and performing the stages in reverse order.

Referring to the encoding method of FIG. 2, the corresponding decoding method comprises mapping each code to a probability index (i.e. in an inverse operation to that of block 204) and then determining the input value that corresponds to each probability index (i.e. in an inverse operation to that of block 202). The mapping from a code to a probability index (in the inverse of block 204) uses the same binomial coefficients (and hence may use an identical LUT) as were used in the code generation.

Figure 24:
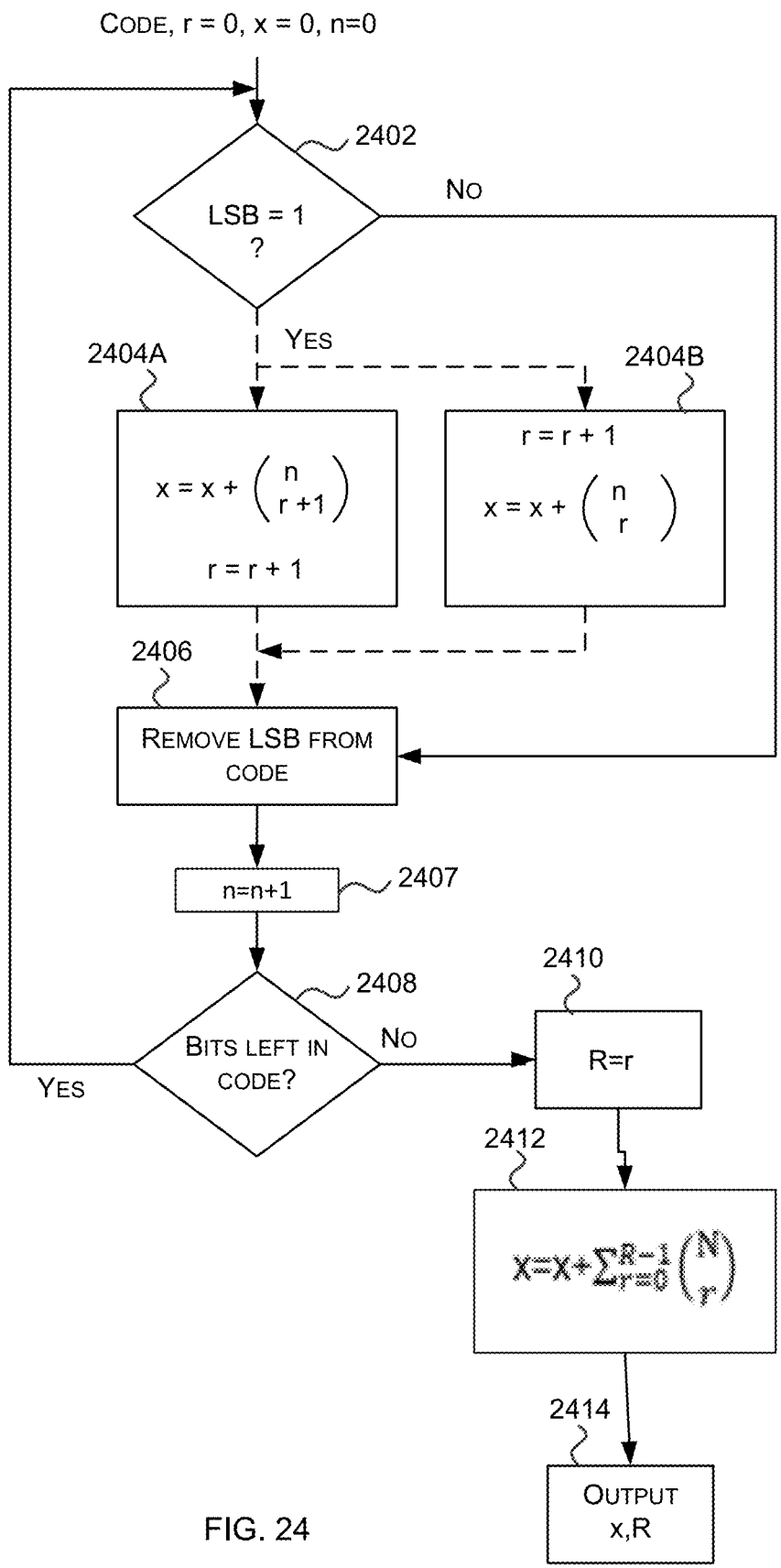
FIG. 24 is a flow diagram showing an example mapping method for use when decoding data.

Referring to the mapping method described with reference to FIGS. 5A, 5B, 6A and 6B, the code may be mapped back to a probability index by determining the position of the code within its respective subset by reversing these methods as shown in FIG. 24. The method iterates using three parameters, n, x and r, which may all initially be set to zero. The method examines the LSB of the code and if it is a one (Yes' in block 2402), the values of x and r, are updated (block 2404A or 2404B, with the implementation of block 2404B being more efficient as it saves on an addition operation). Irrespective of the value of the LSB, the LSB is then removed from the code (block 2406), the value of n is incremented (block 2407) and the method continues to examine the new LSB in each subsequent iteration until there are no bits left in the code ('No' in block 2408). At this point (i.e. after 'No' in block 2408), the final value of r is set as the Hamming Weight, R (in block 2410) and the final value of x may be calculated in block 2412 as $$x = x + \Sigma_{r=0}^{R-1} \binom{N}{r},$$

where the value of the cumulative binomial coefficient may be read from a LUT. The final value of x (as calculated in block 2412) is then output (block 2414).

Whilst the method of FIG. 24 involves the removal of the LSB in each iteration of the loop (in block 2406), in other examples, the method may step through the binary code from LSB to MSB. In such examples, the decision block at the end of the loop (block 2408) may be expressed as 'n<N?' and this variation may also be used where the LSBs are removed (as shown in FIG. 24).

In the method of FIG. 24, the incrementing of x within the loop (in block 2404A or 2404B) corresponds to the inverse operation of FIG. 6A, i.e. finding the output code within a subset corresponding to a given Hamming Weight R. The addition of the final binomial coefficient to x after the loop (in block 2412) corresponds to undoing the operation of FIG. 5A or 5B, i.e. finding the subset given by Hamming Weight R that the original x falls in to, and modifying it to a relative index accordingly.

Referring to the table shown in FIG. 7 that may be used for both mapping probability indices to codes and codes to probability indices, the ones and zeros in the code describe a path through the table (from left to right) where each binomial coefficient reached after a bit value of one is accumulated to the current total (which initially is zero). Starting with the LSB of the code word, each one corresponds to a step down and right and the binomial coefficient reached by the step is added to the current total. Each zero in the code corresponds to a step to the right only and in this case the current total is not modified. As there are N bits and R ones in the code, the process terminates at a position $$\binom{N-1}{R}.$$

This therefore corresponds to the blocks inside the loop of FIG. 24. The final total is added to the cumulative binomial coefficient $$\sum_{r=0}^{R-1}\binom{N}{r}$$

to produce the probability index of the code word and this corresponds to the blocks after the loop of FIG. 24.

Having generated the probability index, this is mapped back to an input value. Where this probability sorting (in block 202) used sign remapping, the input value may be identified by undoing the sign remapping by: removing the LSB, shifting the remaining bits to the right by one bit position (which involves adding a zero as MSB) and then XORing all L-bits (i.e. the bits remaining after removal of the LSB plus the newly added MSB) with the removed LSB. Where the modified sign remapping is used for floating-point inputs, this operation is inverted by moving the LSB to the MSB only. Consequently, the probability index and the input value both comprise L-bits. In those examples where decorrelation (in block 902) was performed when encoding the input values, the values generated by the inverse sign remapping are the decorrelated input values and hence the method further comprises reversing the decorrelation e.g. by shifting the reference value by the median value and then offsetting the other values by the modified reference value or in general undoing the original linear or affine transformation. However, where no decorrelation was performed when encoding the input values, the values generated by the inverse sign remapping are the actual input values and the decoding is complete.

Where the probability indices were generated from input values by referencing a LUT, the input values are likewise decoded from the probability indices by referencing the LUT in reverse.

Referring to the encoding method of FIG. 16, when used independently of any of the other methods described herein, the corresponding decoding method comprises, for each section of bits (where there may be one or more sections in a data word), reading the value of the corresponding padding bit and if the padding bit indicates that the section was flipped during the encoding process, flipping all the bits in the section and resetting the padding bit to its default value and if the padding bit indicates that the section was not flipped during the encoding process, leaving the bits in the section unchanged and resetting the padding bit to its default value.

FIGS. 3, 14A and 14B show example LUTs and it will be appreciated that in other examples the entries within each subset (e.g. each HW subset for FIGS. 3 and 14A) may be rearranged to reduce the number of gates required to encode the LUT.

Figure 18:
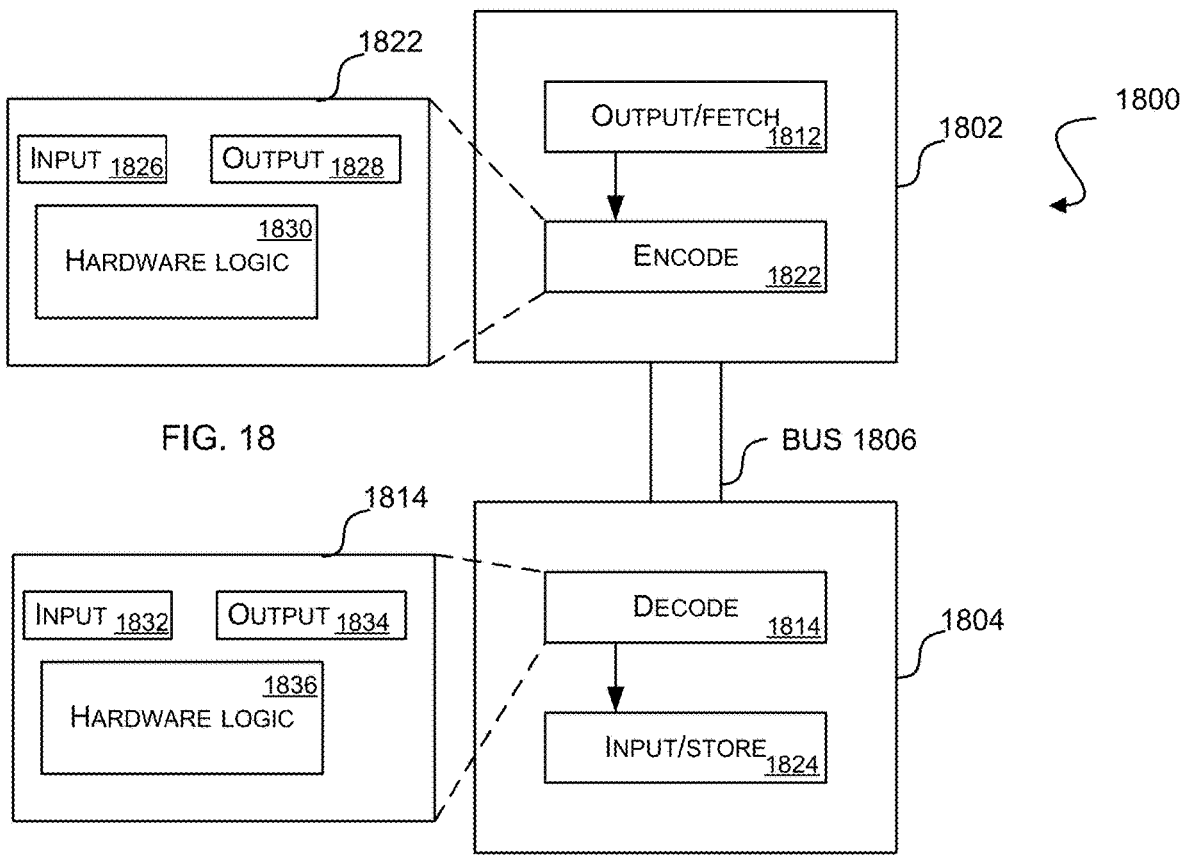
FIGS. 18 and 19 show two example hardware implementations that comprise hardware logic configured to perform one of the methods described herein.
Figure 19:
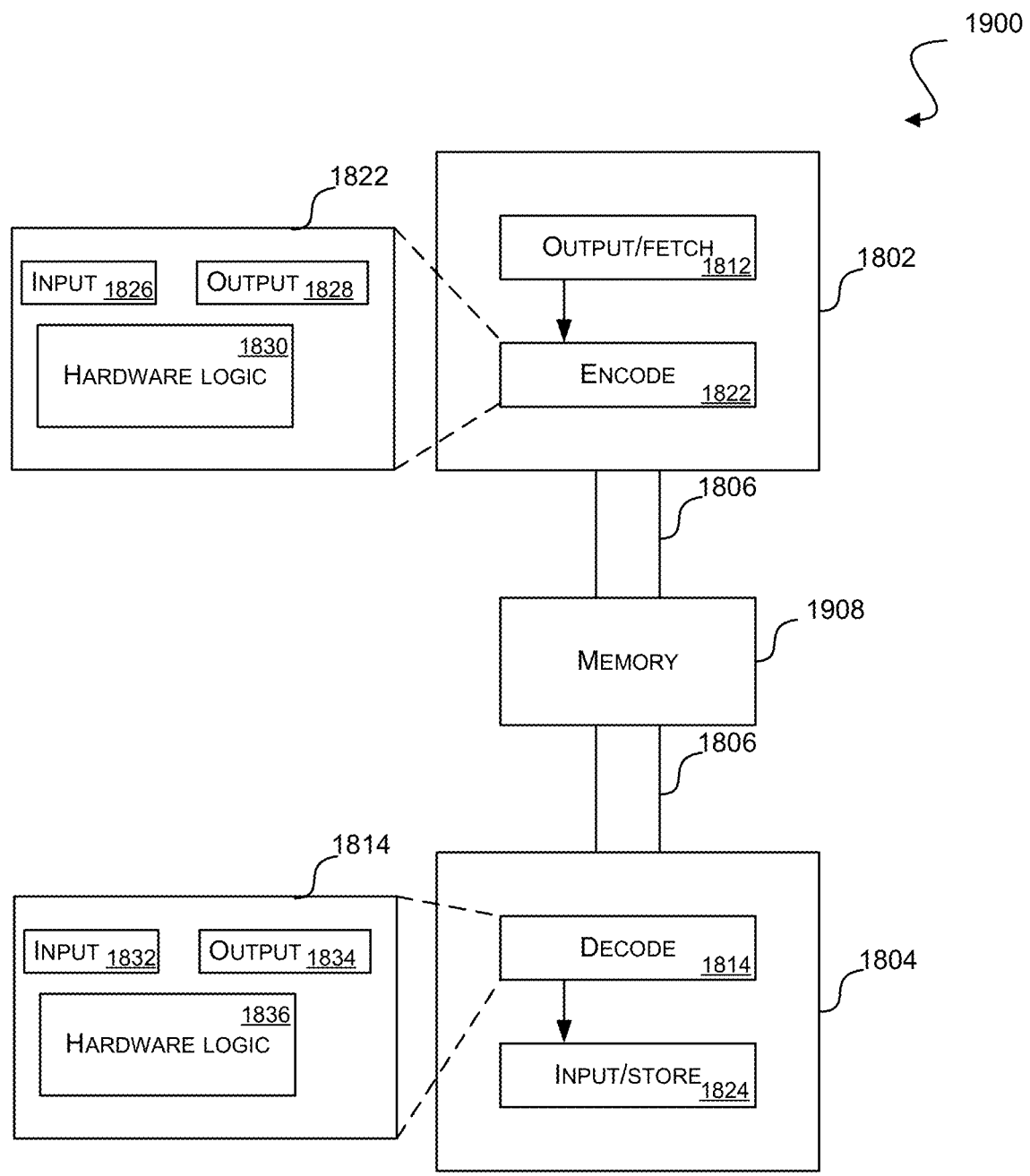

FIGS. 18 and 19 show two example hardware implementation scenarios 1800, 1900 in which the methods described herein may be implemented. In the first example, shown in FIG. 18, two computing entities 1802, 1804 are shown and these may be peripheral devices, processors or memory. The first computing entity 1802 in FIG. 18 comprises a fetch/output hardware block 1812 that is arranged to output the data values to an encoding hardware block 1822 that is arranged to perform one of the encoding methods described herein. The resulting encoded data is carried over a bus 1806 and decoded at the second computing entity 1804. The second computing entity comprises a decoding hardware block 1814 that is arranged to perform the inverse of the encoding method implemented by the first computing entity 1802 and the decoded data items are then input to an input/store hardware block 1824.

In various examples, the encoding hardware block 1822 comprises an input 1826, output 1828 and hardware logic 1830, which may be referred to as mapping hardware logic. The input 1826 is configured to receive a plurality of input values, the mapping hardware logic 1830 is arranged to map each input value to one of a pre-defined set of codes based on a probability distribution of the input values and a characteristic of the code wherein the characteristic of the code comprises either the Hamming Weight of the code or a number of bit flips within the code and the output 1828 is arranged to output the codes corresponding to the received input values. In such examples, the decoding hardware block 1814 comprises an input 1832, output 1834 and hardware logic 1836, which may be referred to as mapping hardware logic. The input 1832 is configured to receive a plurality of input codes, the mapping hardware logic 1836 is arranged to map each input code to one of a pre-defined set of decoded values based on a probability distribution of the decoded values and a characteristic of the code wherein the characteristic of the code comprises either the Hamming Weight of the code or a number of bit flips within the code and the output 1834 is arranged to output the decoded values corresponding to the received input codes.

In other examples, the encoding hardware block 1822 still comprises an input 1826 and output 1828 and hardware logic 1830. As described above, the input 1826 is configured to receive a plurality of input values, however, in these examples, each input word comprises one or more input values and one or more padding bits. In these examples the hardware logic 1830 operates differently and is instead arranged to determine whether more than half of the bits in a portion of an input word are ones and in response to determining that more than half of the bits in a portion of an input word are ones, to generate an output word by inverting all the bits in the portion and setting a padding bit to a value to indicate the inversion. In these examples the output 1828 is arranged to output the output words. In these examples, the decoding hardware block 1814 comprises an input 1832, output 1834 and hardware logic 1836. The input 1832 is configured to receive a plurality of input words where each input word comprises one or more sections of bits and a padding bit corresponding to each section. The hardware logic 1836 is arranged, for each section of an input word, to: read and analyse the value of the corresponding padding bit; in response to determining that the padding bit indicates that the section was flipped during the encoding process, flip all the bits in the section and reset the padding bit to its default value; and in response to determining that the padding bit indicates that the section was not flipped during the encoding process, leave the bits in the section unchanged and reset the padding bit to its default value. The output 1834 is arranged to output the resultant bits as a decoded word.

In the second example, shown in FIG. 19, there are three computing entities 1802, 1804, 1908. The first two of these are as described above with reference to FIG. 18 and the third entity 1908 is a memory. In this second example, unlike the first example, encoded data is carried on the bus 1806 as well as stored in the memory 1908 and the data is not decoded until it is needed by the second computing entity 1804. In this second example, it will be appreciated that the first and second computing entities 1802, 1804 may be the same computing entity.

It will be appreciated that the computing entities 1802, 1804 shown in FIGS. 18 and 19 may comprise many additional elements not shown in FIGS. 18 and 19, e.g. the encode and decode blocks may be respectively pre- and post-processed by other pairs of encode/compression and decode/decompression blocks, to further modify the encoding to improve other properties independent of reducing the HW.

There are many example use cases for the methods described herein. For example, when writing out pixel data from buffer to screen and in this example, the data is often both correlated and padded. The methods described herein may also be used as part of a video system after decoding the normal variable length compression, before being passed on to the screen or other device. The methods described herein may replace or be coupled with any compression/decompression pipeline (as this data will typically have a correlated distribution). This improves the system from just bandwidth saving to also power saving. Compression/decompression pipeline are widely used as compression is routinely applied to mages/video/textures/audio etc. The methods may also be used for other types of correlated data or data padded up to a power of 2 bits (e.g. user defined structures that do not fill a power of two bytes).

FIG. 12, which is described above, shows the effect of additional padding bits on the first method (e.g. the method of FIGS. 1-16) described herein. As shown in FIG. 12, this method continues to gain benefit up to a total of $2^L - L - 1$ pad bits, albeit with each additional padding bit having a more and more minimal effect. In contrast, the second method (as described above with reference to FIG. 16) does not benefit from having more than L/2 pad bits (as no benefit is gained by using a flag bit on input values of fewer than 2 bits). Some example maximal numbers of padding bits for both methods are given below for various values of L:

| Number of bits, L | Max P, First method (FIGS. 1-15A, 15B) | Max P, Second method (FIG. 16) |
|---|---|---|
| 1 | 0 | 0 |
| 2 | 1 | 1 |
| 3 | 4 | 1 |
| 4 | 11 | 2 |

-continued

| Number of bits, L | Max P, First method (FIGS. 1-15A, 15B) | Max P, Second method (FIG. 16) |
|---|---|---|
| 5 | 26 | 2 |
| 6 | 57 | 3 |
| 7 | 120 | 3 |
| 8 | 247 | 4 |

The efficiency that may be achieved using the methods described above (apart from the method of FIG. 16) may be demonstrated as set out below.

Let $i \in 2^N = \{0, 1, \ldots 2^N - 1\}$ be the encoded input values

Let $p_i \in [0, 1]$ be the probabilities of i, such that $$\sum_{i \in 2^N} p_i = 1$$

Let $H: 2^N \to \mathbb{N}$, $i \mapsto H_i$ be the Hamming Weight function

Then the average Hamming Weight W is given by $$W = \sum_{i \in 2^N} p_i H_i$$

Let $H^n$ be the set of codes of Hamming Weight $n \in \{0, 1, \ldots N\}$

Let $p^n$ be the sum of the probabilities for codes in $H^n$, then $$W = \sum_{n=0}^{N} \sum_{i \in H^n} p_i H_i = \sum_{n=0}^{N} n \sum_{i \in H^n} p_i = \sum_{n=0}^{N} n p^n, \text{ such that } \sum_{n=0}^{N} p^n = 1$$

It can be proven that W is minimised precisely when the following criterion is satisfied:

$$p_{i_0} \geq p_{i_1} \geq \ldots \geq p_{i_N} \text{ for all } i_0 \in H^0, i_1 \in H^1, \ldots i_n \in H^N \quad (*)$$

Assuming that the codes have been assigned to the probabilities such that they satisfy the above criterion (*), a first selection is made of any two Hamming Weight bucket indices i and j in $\{0, 1, \ldots N\}$, w log j≤k, and a selection is made of any two indices $i_j \in H^j$ and $i_k \in H^k$ from those buckets, with probabilities $p_{i_j}$ and $p_{i_k}$ respectively. This gives:

$$k = j + l, l \in \mathbb{N}_0$$

$$(*) \Rightarrow p_{i_j} = p_{i_k} + \epsilon, \epsilon \in \mathbb{R}_{\geq 0}$$

Swapping the probabilities of $i_j$ and $i_k$ gives the new average hamming weight W', which is greater than or equal to W as:

$$W' = \sum_{n=0}^{N} \sum_{i \in H^n} p_i H_i =$$

$$\Sigma + p_{i_j} H_{i_k} + p_{i_k} H_{i_j} = \Sigma + p_{i_j} k + p_{i_k} j = \Sigma + (p_{i_k} + \epsilon)(j + l) + p_{i_k} j =$$

$$\Sigma + p_{i_k} j + p_{i_k} l + \epsilon j + \epsilon l + p_{i_k} j = \Sigma + p_{i_k}(j + l) + (p_{i_k} + \epsilon)j + \epsilon l =$$

$$\Sigma + p_{i_k} k + p_{i_j} j + \epsilon l = W + \epsilon l \geq W$$

Therefore W'≥W with equality if and only if either k=j, i.e. the two encoded values already have the same Hamming Weight, or if $p_{i_j} = p_{i_k}$, i.e. the two encoded values have the same probability. In either case the transposed codes also satisfy (*).

Hence, it has been shown that the criterion given in (*) determines a set of H.W-minimal encodings for the given probability distribution, and are all local minima. By considering any other encoding with probabilities not ordered in this way, it is clear by the same logic that there exists a transposition on a pair of probabilities that reduces the average Hamming Weight by some non-zero amount—therefore they are in fact all global minima.

If using the second method above (i.e. the bit-flip method of FIG. 16) as an alternative scheme to reduce the average Hamming Weight of the encoded values (i.e. if more than half the bits are set then all the bits are flipped and one of the padding bits is flagged to identify this) then, as the encoded values are modified in a fixed way irrespective of the data's probability distribution, it requires data of a particular type to be effective. This is data with the probability distribution skewed towards codes with either few 1s or few 0s, and conversely the worst kind of data is those with probability skewed towards codes with similar numbers of 0s and 1s. Signed data fits quite well into the effective type of distribution, so decorrelating data should also benefit this method.

This can be shown explicitly by the following logic, where N=L+1, i.e. a single bit of padding is used for the flag and N and L are the lengths of the code with and without the padding bit flag respectively:

$$W' = \sum_{n=0}^{\lfloor L/2 \rfloor} \sum_{i \in H^n} p_i H_i + \sum_{n=\lfloor L/2 \rfloor+1}^{L} \sum_{i \in H^n} p_i(N - H_i)$$

Figure 20:
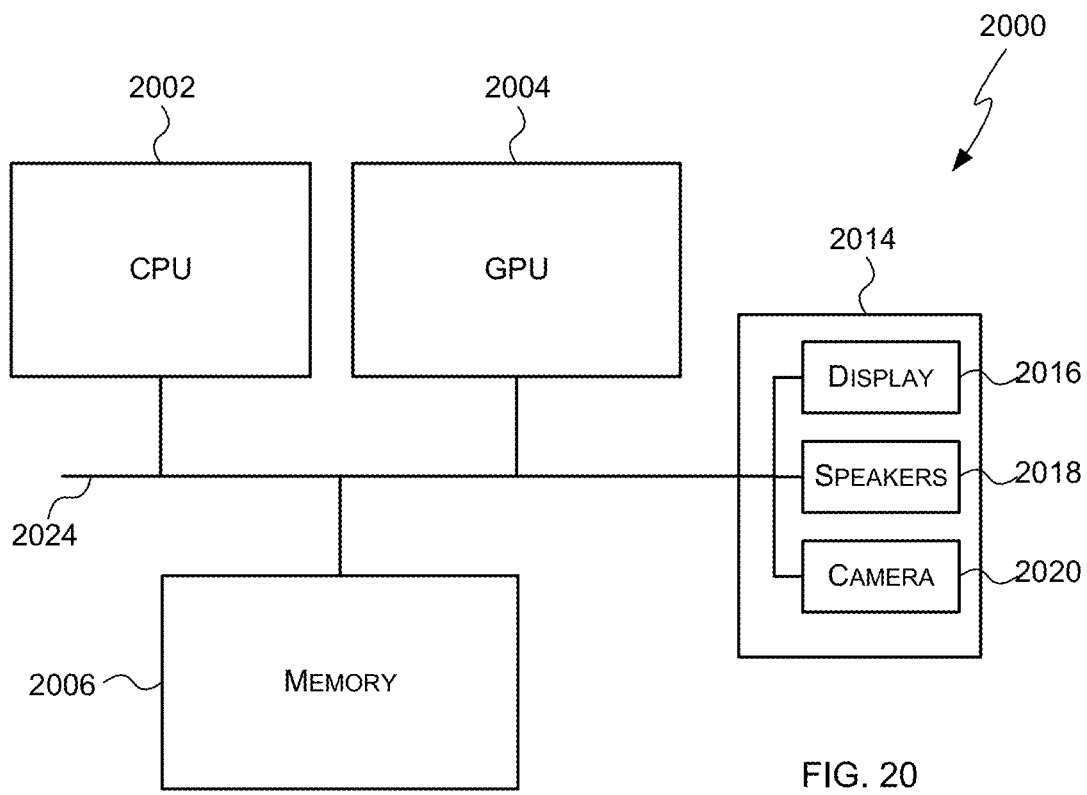
FIG. 20 shows a computer system in which hardware logic (such as a processor or part thereof) arranged to perform a method as described herein is implemented.

This is optimal when:

$p_{i_0} \geq p_{i_1} \geq \ldots p_{i_{[L/2]}}$ for all $i_0 \in H^0, i_1 \in H^1 \cup H^L, \ldots$
$i_{[L/2]} \in H^{[L/2]} \cup H^{L-[L/2]}$ FIG. 20 shows a computer system 2000 in which the methods described herein may be implemented. The computer system comprises a CPU 2002 (which may correspond to the CPU 1800 shown in FIG. 18 and described above) and a GPU 2004 (which may correspond to the GPU 1900 shown in FIG. 19 and described above). In addition the computer system 2000 comprises a memory 2006 and other devices 2014, such as a display 2016, speakers 2018 and a camera 2020. A processing block 910 (corresponding to processing blocks 110) is implemented on the GPU 904. The components of the computer system communicate with each other via a communications bus 2024.

The processors of FIGS. 18 and 19 and the computer system of FIG. 20 are shown as comprising a number of functional blocks. This is schematic only and is not intended to define a strict division between different logic elements of such entities. Each functional block may be provided in any suitable manner.

The processors described herein may be embodied in hardware on an integrated circuit. The processors described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or a netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a processor configured to perform any of the methods described herein, or to manufacture a computing system comprising any apparatus described herein. An integrated circuit definition dataset may be, for example, an integrated circuit description.

Therefore, there may be provided a method of manufacturing, at an integrated circuit manufacturing system, a processor or other hardware logic configured to perform one of the methods as described herein. Furthermore, there may be provided an integrated circuit definition dataset that, when processed in an integrated circuit manufacturing system, causes the method of manufacturing such a processor or hardware logic to be performed. In various examples, a coding method may be implemented in software/firmware (e.g. using block 202 plus the iterative processes in FIG. 5A or 5B and in FIG. 6A or 6B). In other examples, the methods may be implemented as a fixed function hardware unit that uses a data structure (e.g. a set of gates or array of table entries) to encode part or all of the mapping (as a LUT) and/or a set of connected arithmetic units to perform the methods of FIG. 5A or 5B and FIG. 6A or 6B.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a processor or other hardware logic configured to perform one of the methods as described herein will now be described with respect to FIG. 21.

Figure 21:
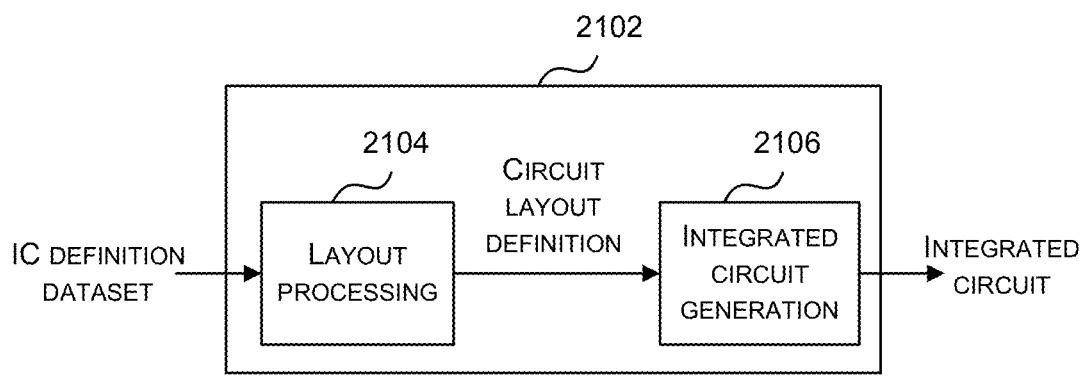
FIG. 21 shows an integrated circuit manufacturing system for generating an integrated circuit embodying hardware logic (such as a processor or part thereof) arranged to perform a method as described herein.

FIG. 21 shows an example of an integrated circuit (IC) manufacturing system 2102 which is configured to manufacture a processor or other hardware logic arranged to perform one of the methods as described herein. In particular, the IC manufacturing system 2102 comprises a layout processing system 2104 and an integrated circuit generation system 2106. The IC manufacturing system 2102 is configured to receive an IC definition dataset (e.g. defining a processor 1800, 1900 as described in any of the examples herein), process the IC definition dataset, and generate an IC according to the IC definition dataset (e.g. which embodies hardware logic arranged to perform a method as described in any of the examples herein). The processing of the IC definition dataset configures the IC manufacturing system 2102 to manufacture an integrated circuit embodying hardware logic arranged to perform a method as described in any of the examples herein.

The layout processing system 2104 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 2104 has determined the circuit layout it may output a circuit layout definition to the IC generation system 2106. A circuit layout definition may be, for example, a circuit layout description.

The IC generation system 2106 generates an IC according to the circuit layout definition, as is known in the art. For example, the IC generation system 2106 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1006 may be in the form of computer-readable code which the IC generation system 1006 can use to form a suitable mask for use in generating an IC.

The different processes performed by the IC manufacturing system 2102 may be implemented all in one location, e.g. by one party. Alternatively, the IC manufacturing system 2102 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture hardware logic arranged to perform a method as described herein without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 21 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 21, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget."

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:
1. A method of encoding data values, the method comprising:
    receiving a plurality of input words, each input word comprising one or more input values and one or more padding bits;

dividing the bits of the one or more input values in the input word into a plurality of portions, at least one of the portions having a corresponding padding bit in the input word, for each of the portions having a corresponding padding bit in the input word, determining whether more than half of the bits in the portion have a predefined bit value; and in response to determining that more than half of the bits in the portion are ones, generating an output word by inverting all the bits in the portion and setting a padding bit to a value to indicate the inversion.

2. The method according to claim 1, further comprising:
in response to determining that not more than half of the bits in a portion of an input word have the predefined bit value, generating an output word by not inverting the bits in the portion and by setting a padding bit to a value to indicate that the bits in the portion have not been inverted.

3. The method according to claim 1, wherein said one or more input values comprise a plurality of input values.

4. The method according to claim 1, wherein the portion of the input word comprises the one or more input values.

5. The method according to claim 1, wherein each of the plurality of portions has a corresponding padding bit in the input word.

6. The method according to claim 1, wherein the input values have a non-uniform probability distribution.

7. The method according to claim 1, wherein the input values have a uniform probability distribution.

8. The method according to claim 1, further comprising:
receiving a plurality of initial input words, each initial input word comprising one or more initial input values; and decorrelating the initial input values in the initial input words to thereby generate the input values of the input words for which said determination is performed of whether more than half of the bits in a portion of the input words have the predefined bit value.

9. The method according to claim 1, wherein the predefined bit value is a one.

10. The method according to claim 1, wherein the predefined bit value is a zero.

11. A computing entity comprising an encoding hardware block, the encoding hardware block comprising:

an input configured to receive a plurality of input values, each input word comprising one or more input values and one or more padding bits;

hardware logic arranged to divide the bits of the one or more input values in the input word into a plurality of portions, at least one of the portions having a corresponding padding bit in the input word, and for each of the portions having a corresponding padding bit in the input word, to determine whether more than half of the bits in the portion have a predefined bit value and in response to determining that more than half of the bits in the portion have the predefined bit value, to generate an output word by inverting all the bits in the portion and setting a padding bit to a value to indicate the inversion;

and an output for outputting the output words.

12. The computing entity according to claim 11, wherein the predefined bit value is a one.

13. The computing entity according to claim 11, wherein the predefined bit value is a zero.

14. A method of decoding data values, the method comprising:

receiving a plurality of input words, each input word comprising a plurality of sections of bits and a padding bit corresponding to each section; and for each section of an input word:
reading and analysing the value of the corresponding padding bit;

in response to determining that the padding bit indicates that the section was flipped during the encoding process, flipping all the bits in the section and resetting the padding bit to its default value;

in response to determining that the padding bit indicates that the section was not flipped during the encoding process, leaving the bits in the section unchanged and resetting the padding bit to its default value; and outputting the resultant bits as a decoded word.

15. A non-transitory computer readable storage medium having stored thereon an integrated circuit definition dataset that, when processed in an integrated circuit manufacturing system, configures the integrated circuit manufacturing system to manufacture a computing entity as set forth in claim 11.

16. An integrated circuit manufacturing system configured to manufacture a computing entity as set forth in claim 11.

17. An integrated circuit manufacturing system comprising:

a non-transitory computer readable storage medium having stored thereon a computer readable description of an integrated circuit that describes a computing entity as set forth in claim 11;

a layout processing system configured to process the integrated circuit description so as to generate a circuit layout description of an integrated circuit embodying the computing entity; and an integrated circuit generation system configured to manufacture the computing entity according to the circuit layout description.

18. A non-transitory computer readable storage medium having encoded thereon computer readable code configured to cause the method of claim 1 to be performed when the code is run.

* * * * *